(12) United States Patent
Imura et al.

(10) Patent No.: US 10,690,724 B2
(45) Date of Patent: *Jun. 23, 2020

(54) POWER SUPPLY PROTECTIVE DEVICE, POWER SUPPLY DEVICE AND SWITCH FAILURE DIAGNOSING METHOD

(71) Applicant: GS Yuasa International Ltd., Kyoto-shi (JP)

(72) Inventors: Masayuki Imura, Kyoto (JP); Tomohiro Kawauchi, Kyoto (JP); Yoshihiko Mizuta, Kyoto (JP); Takeshi Nakamoto, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/418,787

(22) Filed: May 21, 2019

(65) Prior Publication Data

US 2019/0271743 A1 Sep. 5, 2019

Related U.S. Application Data

(63) Continuation of application No. 15/538,147, filed as application No. PCT/JP2015/006461 on Dec. 24, 2015, now Pat. No. 10,338,141.

(30) Foreign Application Priority Data

Dec. 24, 2014 (JP) ................................. 2014-260499
May 8, 2015 (JP) ................................. 2015-095493

(51) Int. Cl.
*G01R 31/327* (2006.01)
*H01M 10/48* (2006.01)
(Continued)

(52) U.S. Cl.
CPC ....... *G01R 31/3277* (2013.01); *G01R 19/165* (2013.01); *G01R 31/2607* (2013.01);
(Continued)

(58) Field of Classification Search
CPC .... H01M 2/34; H01M 10/42; H01M 10/4207; H01M 10/4257; H01M 10/625;
(Continued)

(56) References Cited

U.S. PATENT DOCUMENTS 8,405,357 B2 * 3/2013 Saeki ...................... H01M 2/34
320/134
8,963,457 B2 * 2/2015 Sugiyama .............. B60L 58/15
318/139

(Continued)

FOREIGN PATENT DOCUMENTS

FR 2 991 461 A1 12/2013
JP H 11-185830 A 7/1999
(Continued)

OTHER PUBLICATIONS

Office Action in U.S. Appl. No. 15/538,147 dated Dec. 6, 2018.
(Continued)

*Primary Examiner* — Vinh P Nguyen
(74) *Attorney, Agent, or Firm* — McGinn IP Law Group, PLLC

(57) ABSTRACT

A power supply protective device, includes: a first switch provided between a first terminal to which at least one of a load and a charger is connected and a second terminal to which a power supply is connected; a switching circuit connected in parallel to the first switch and including a second switch and a voltage drop element connected in series to the second switch, the voltage drop element causing a voltage drop of a reference voltage by a current flow; a voltage detection unit which detects at least one voltage of
(Continued)

a first voltage as a voltage of the first terminal, a second voltage as a voltage of the second terminal, and a third voltage as a voltage at a point between the second switch and the voltage drop element; and a control unit.

20 Claims, 14 Drawing Sheets

(51) Int. Cl.
| | |
|---|---|
| *H02H 7/00* | (2006.01) |
| *H02H 7/20* | (2006.01) |
| *H02J 7/00* | (2006.01) |
| *G01R 19/165* | (2006.01) |
| *G01R 31/26* | (2020.01) |
| *H01M 2/34* | (2006.01) |
| *H01M 10/42* | (2006.01) |
| *H02H 1/00* | (2006.01) |
| *H02H 7/18* | (2006.01) |

(52) U.S. Cl.
CPC .......... *H01M 2/34* (2013.01); *H01M 10/425* (2013.01); *H01M 10/48* (2013.01); *H02H 1/0007* (2013.01); *H02H 7/00* (2013.01); *H02H 7/18* (2013.01); *H02H 7/20* (2013.01); *H02J 7/00* (2013.01); *H02J 7/0029* (2013.01); *H01M 2200/00* (2013.01); *H01M 2220/20* (2013.01)

(58) Field of Classification Search
CPC .. H01M 10/633; H01M 2200/00; H01M 2/20; H01M 2/30; H01M 10/425; H01M 10/48; H01M 2220/20; H02H 1/0007; H02H 7/20; H02H 3/06; H02H 3/18; H02H 7/18; H02H 1/06; H02H 3/021; H02H 7/222; G01R 31/3842; G01R 31/025; G01R 31/36; G01R 19/16528; G01R 19/1659; G01R 19/252; G01R 27/08; G01R 27/14; G01R 27/18; G01R 31/327; G01R 31/3278; G01R 31/364; G01R 31/3646; G01R 31/3647; G01R 31/396; G01R 31/40; G01R 33/0283; G01R 19/165; G01R 31/2607; G01R 31/3277; H02J 7/00; H02J 7/0029; H02J 7/0052
See application file for complete search history.

(56) References Cited

U.S. PATENT DOCUMENTS

| | | | |
|---|---|---|---|
| 9,130,383 | B2 | 9/2015 | Mukai |
| 9,337,648 | B2 | 5/2016 | Badie |
| 9,762,054 | B2 * | 9/2017 | Itagaki .................. B60L 3/0046 |
| 10,389,148 | B2 * | 8/2019 | Kim .................... H01M 10/443 |
| 2003/0027036 | A1 | 2/2003 | Emori |
| 2013/0320986 | A1 | 12/2013 | Shiraishi et al. |
| 2014/0203735 | A1 | 7/2014 | Sugiyama et al. |
| 2016/0193929 | A1 | 7/2016 | Sakakibara |

FOREIGN PATENT DOCUMENTS

| | | |
|---|---|---|
| JP | 2003-102101 A | 4/2003 |
| JP | 2003-324801 A | 11/2003 |
| JP | 2005-080456 A | 3/2005 |
| JP | 2005-184910 A | 7/2005 |
| JP | 2008-182872 A | 8/2008 |
| JP | 2011-014282 A | 1/2011 |
| JP | 2011-229216 A | 11/2011 |
| JP | 2012-178895 A | 9/2012 |
| JP | 2013-005528 A | 1/2013 |
| JP | 5288041 B1 | 9/2013 |
| JP | 2014-036556 A | 2/2014 |
| JP | 2015-008600 A | 1/2015 |
| JP | 2015-095442 A | 5/2015 |
| WO | WO 2004/095667 A1 | 11/2004 |
| WO | WO 2015/040890 A1 | 3/2015 |

OTHER PUBLICATIONS

Notice of Allowance in U.S. Appl. No. 15/538,147 dated Feb. 25 2019.
European Search Report dated Jul. 18, 2018 for European Patent Application No. 15872292.6.
International Search Report (ISR) (PCT Form PCT/ISA/210), in PCT/JP2015/006461, dated Mar. 8, 2016.

* cited by examiner

Fig. 3

|  | First switch | Second switch | Normal | First switch, open failure | First switch, closed failure |
|---|---|---|---|---|---|
| VAD | Open | Closed | VB−VF | VB−VF | VB |
| VAE | Closed | Closed | VB | VB−VF | VB |
| ΔV |  |  | VF | 0 | 0 |
| VG | Closed | Open |  | 0 | VB |

Fig. 6

|  | First switch | Second switch | Normal | First switch, open failure | First switch, closed failure |
|---|---|---|---|---|---|
| VCD | Open | Closed | VF | VF | 0 |
| VCE | Closed | Closed | 0 | VF |  |

Fig. 7

|  | First switch | Second switch | First switch (Second switch) | | |
|---|---|---|---|---|---|
|  |  |  | Normal | Open failure | Closed failure |
| VCD | Open | Closed | VF (Normal, Closed) | VF (Normal, Closed) | 0 |
|  |  |  | VB (Open) | VB (Open) |  |
| VCE | Closed | Closed | Normal | Open failure |  |
|  |  |  | 0 | VF (Normal, Closed) |  |
|  |  |  |  | VB (Open) |  |
| VH | Open | Open | Normal | Open failure |  |
|  |  |  | VB (Normal) | VB (Normal) |  |
|  |  |  | VF (Closed) | VF (Closed) |  |

Fig. 13

| Kind of failure to be diagnosed | First switch | Second switch | Third switch | In normal state | At failure |
|---|---|---|---|---|---|
| First switch, open failure | Closed instruction | Closed instruction | Open instruction | $\Delta VAB=0$ | $\Delta VAB=VF$ |
| Second switch, open failure | Closed instruction | Closed instruction | Closed instruction | $VC=VB$ | $VC=0$ |
| First switch, closed failure | Open instruction | Closed instruction | Open instruction | $\Delta VAB=VF$ | $\Delta VAB=0$ |
| Second switch, closed failure | Closed instruction | Open instruction | Closed instruction | $VC=0$ | $VC=VB$ |

POWER SUPPLY PROTECTIVE DEVICE, POWER SUPPLY DEVICE AND SWITCH FAILURE DIAGNOSING METHOD

The present application is a Continuation Application of U.S. patent application Ser. No. 15/538,147, filed on Jun. 20, 2017, now U.S. Pat. No. 10,338,141, which is based on International Patent Application No. PCT/JP2015/006461, filed on Dec. 24, 2015, and Japanese Patent Application Nos. 2014-260499, filed on Dec. 24, 2014, and 2015-095493, filed on May 8, 2015, the contents of which are incorporated herein by reference in its entirety.

TECHNICAL FIELD

A technique disclosed in the present specification relates to a power supply protective device.

BACKGROUND ART

Power supply protective devices have been conventionally proposed which have a plurality of switches connected in parallel between a battery and a load, and determine presence/absence of a failure of any of the plurality of switches (see Patent Documents 1 and 2).

PRIOR ART DOCUMENTS

Patent Documents

Patent Document 1: JP-A-2011-229216
Patent Document 2: JP-A-2008-182872

SUMMARY OF THE INVENTION

Problems to be Solved by the Invention

For such devices having a plurality of switches as the above conventional techniques, a technique for diagnosing a failure of a switch is required. The present specification discloses a technique for diagnosing a failure of a switch by using means different from that of a conventional technique.

Means for Solving the Problems

A secondary battery management device according to one aspect of the present invention includes a first switch provided between a first terminal to which at least one of a load and a charger is connected and a second terminal to which a power supply is connected; a switching circuit connected in parallel to the first switch and including a second switch and a voltage drop element connected in series to the second switch and causing a voltage drop of a reference voltage by a current flow; a voltage detection unit which detects at least one voltage of a first voltage as a voltage of the first terminal, a second voltage as a voltage of the second terminal, and a third voltage as a voltage at a point between the second switch and the voltage drop element; and a control unit which gives, to the first switch and the second switch, an open instruction to bring the switch into an open state and a close instruction to bring the switch into a closed state to control switching, and obtains a voltage from the voltage detection unit. The control unit (1) when obtaining an open voltage in a case where the second switch is brought into the closed state and the first switch is brought into the open state during discharging of the power supply, and obtaining a close voltage in a case where the second switch is brought into the closed state and the first switch is brought into the closed state during discharging of the power supply, diagnoses the first switch as having a failure or not on the basis of the open voltage and the close voltage. The control unit (2) when executing first instruction processing of giving the close instruction to the first switch and the second switch, if a voltage difference between the first voltage and the second voltage detected by the voltage detection unit during execution of the first instruction processing is less than a first threshold voltage, determines that the first switch has no open failure, and/or when the third voltage detected by the voltage detection unit during execution of the first instruction processing is not less than a second threshold voltage, determines that the second switch has no open failure.

The technique disclosed in the present specification can be realized in various forms and can be realized, for example, in various modes such as a switch failure diagnosing method of a power supply protective device, a computer program for realizing functions of a power supply protective device or a switch failure diagnosing method, a recording medium which records the computer program, and the like.

BRIEF DESCRIPTION OF THE DRAWINGS

FIG. 3 is a table showing a detection result of an open voltage VAD, a close voltage VAE, and a discrimination voltage VG according to the first embodiment.

FIG. 6 is a table showing a detection result of the open voltage VAD and the close voltage VAE according to the first embodiment.

FIG. 7 is a table showing a detection result of the open voltage VAD, the close voltage VAE, and a cutoff voltage VH according to the first embodiment.

FIG. 13 is a table of failure diagnoses of a first switch and a second switch according to the second embodiment.

MODE FOR CARRYING OUT THE INVENTION

Figure 1:
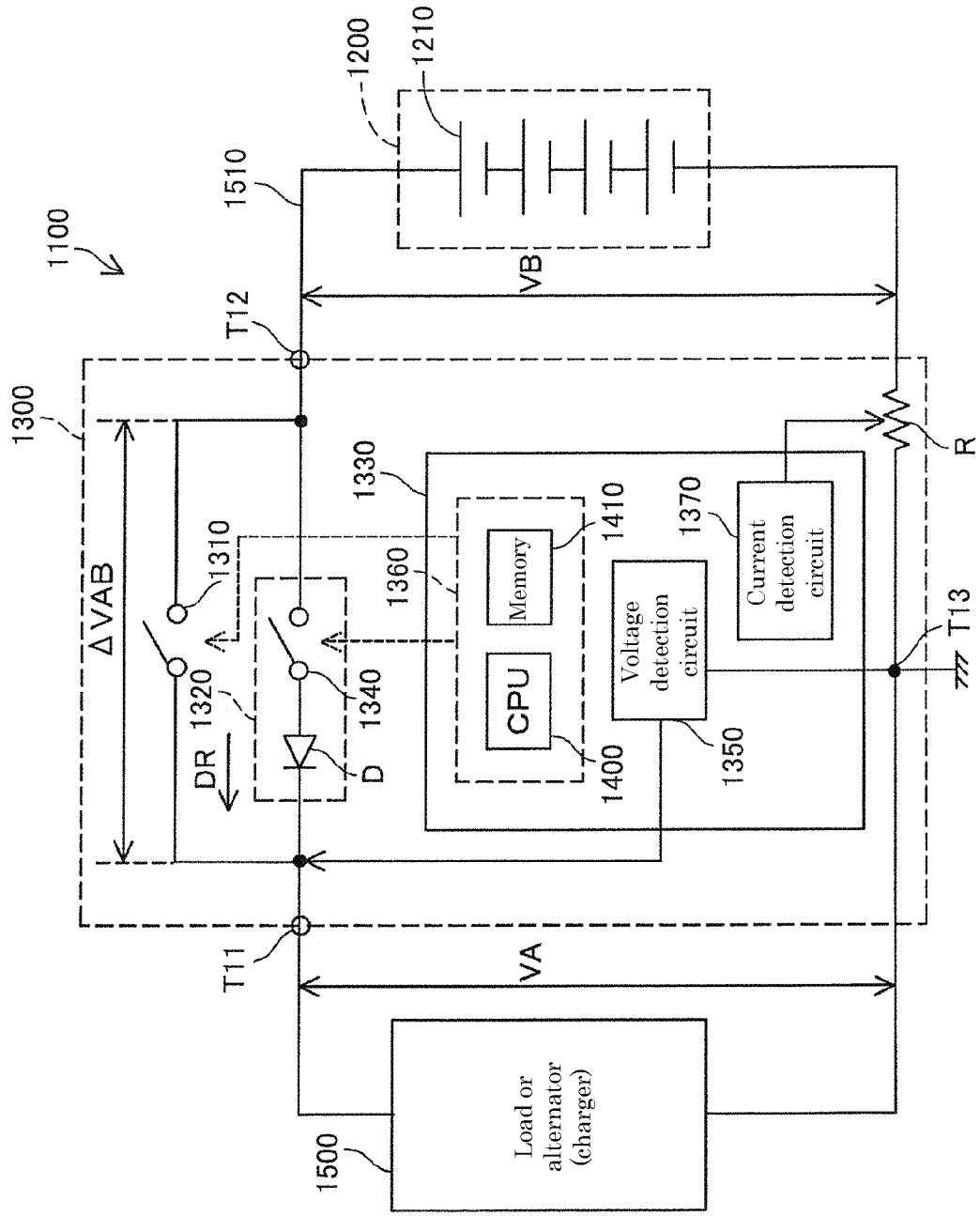
FIG. 1 is a block diagram showing an electrical configuration of a battery protective device according to a first embodiment.

In the above Patent Document 1, at each of time when an open command signal is individually applied to a plurality of switches at different times and time when the open command signal is simultaneously applied, a voltage value of a terminal on a load side of the switch is measured to determine presence/absence of a failure of any of the plurality of switches on the basis of a voltage value obtained by measurement at each time.

Additionally, in the above Patent Document 2, with a first switch and a second switch provided which are connected in parallel between a power supply and a load, presence/absence of a failure of each of these switches is diagnosed. Specifically, a power supply protective device gives a close instruction to the first switch to bring the same into a closed (close) state and gives an open instruction to the second switch to bring the same into an open (opened) state and, when a voltage across the first switch is then larger than a predetermined threshold voltage, diagnoses the first switch as having a failure that the switch fails to enter the closed state even being given the close instruction and remains in the open state (hereinafter, referred to as an "open failure").

In the above conventional techniques, a close instruction is given to the first switch and an open instruction is given to the second switch to diagnose an open failure of the first switch. Therefore, when the first switch has an open failure and the second switch has no failure, in other words, when the first switch is in the open state against the close instruction and the second switch is in the open state according to the open instruction, there occurs a problem that a current path between a power supply and a load is cut off to cut off output of a power supply to the load (hereinafter, referred to as "power fail").

(1) A power supply protective device disclosed in the present specification includes a first switch provided between a first terminal to which at least one of a load and a charger is connected and a second terminal to which a power supply is connected; a switching circuit connected in parallel to the first switch and including a second switch and a voltage drop element connected in series to the second switch and causing a voltage drop of a reference voltage by a current flow; a voltage detection unit which detects at least one voltage of a first voltage as a voltage of the first terminal, a second voltage as a voltage of the second terminal, and a third voltage as a voltage at a point between the second switch and the voltage drop element; and a control unit which gives, to the first switch and the second switch, an open instruction to bring the switch into an open state and a close instruction to bring the switch into a closed state to control switching, and obtains a voltage from the voltage detection unit. The control unit (1) when obtaining an open voltage in a case where the second switch is brought into the closed state and the first switch is brought into the open state during discharging of the power supply, and obtaining a close voltage in a case where the second switch is brought into the closed state and the first switch is brought into the closed state during discharging of the power supply, diagnoses the first switch as having a failure or not on the basis of the open voltage and the close voltage, (2) when executing first instruction processing of giving the close instruction to the first switch and the second switch, if a voltage difference between the first voltage and the second voltage detected by the voltage detection unit during execution of the first instruction processing is less than a first threshold voltage, determines that the first switch has no open failure, and/or when the third voltage detected by the voltage detection unit during execution of the first instruction processing is not less than a second threshold voltage, determines that the second switch has no open failure.

In the power supply protective device, with the voltage drop element connected in series to the second switch, when the first switch has no failure, a voltage difference of a reference voltage is generated between the open voltage and the close voltage. Therefore, making use of the voltage difference enables determination whether the first switch has a failure or not on the basis of the open voltage and the close voltage. Additionally, in the power supply protective device, since when diagnosing a failure of the first switch, an open voltage and a close voltage are obtained with the second switch controlled to be in the closed state, cutoff of a current path between the load and the power supply can be suppressed during discharging of the power supply.

Additionally, in the power supply protective device, determination whether the first switch and the second switch have an open failure or not is made during execution of the first instruction processing of giving the close instruction to the first switch and the second switch. Therefore, unless the first switch and the second switch simultaneously have an open failure, no power fail occurs. In other words, even when one of the switches is in the open state against the close instruction, a current path between the power supply and the load can be ensured via other switch to suppress occurrence of a power fail.

(2) The above power supply protective device may be configured such that the voltage drop element is a diode with a current direction from the power supply side toward the load or the charger side as a forward direction, and the reference voltage is a forward direction voltage of the diode. According to the power supply protective device, making use of the forward direction voltage of the diode enables determination whether the first switch has a failure or not. Since a voltage drop value of the forward direction voltage of the diode is constant, it is easier to determine whether the first switch has a failure or not as compared with a case where the voltage drop value is variable.

(3) The above power supply protective device may be configured such that the voltage detection unit detects a voltage of the first terminal and does not detect a voltage of the second terminal, and the control unit diagnoses the first switch as having a failure or not on the basis of a comparison result obtained by comparing a difference voltage between the close voltage and the open voltage with a third threshold voltage corresponding to the reference voltage. According to the power supply protective device, the voltage detection unit needs to detect only a voltage of the first terminal. Therefore, as compared with detection of a voltage across the first switch, a configuration of the voltage detection unit can be simplified.

(4) The above power supply protective device may be configured such that the control unit diagnoses the first switch as having no failure when a first condition is satisfied that the difference voltage is not less than the third threshold voltage, and diagnoses the first switch as having either an open failure or a closed failure when the first condition is not satisfied. According to the power supply protective device, making use of a difference voltage between an open voltage and a close voltage enables the first switch to be diagnosed as having either an open failure or a closed failure.

(5) The above power supply protective device may be configured such that the control unit obtains a discrimination voltage in a case where the second switch is controlled to be in the open state and the first switch is controlled to be in the closed state during discharging of the power supply, and when the first condition is not satisfied and a second condition is satisfied that the discrimination voltage is not less than the open voltage, diagnoses the first switch as having a closed failure, and when the first condition and the second condition are not satisfied, diagnoses the first switch as having an open failure. According to the power supply protective device, making use of a discrimination voltage in a case where the first switch is controlled to be in the closed state and the second switch is controlled to be in the open state enables a kind of a failure of the first switch to be diagnosed.

(6) The above power supply protective device may be configured such that the voltage detection unit detects a first terminal voltage of the first terminal and a second terminal voltage of the second terminal, and the control unit obtains the first terminal voltage and the second terminal voltage in a case where the second switch is controlled to be in the closed state and the first switch is controlled to be in the open state during discharging of the power supply, obtains the open voltage by subtracting the first terminal voltage from the second terminal voltage, obtains the first terminal voltage and the second terminal voltage in a case where the second switch is controlled to be in the closed state and the first switch is controlled to be in the closed state during discharging of the power supply, obtains the close voltage by subtracting the first terminal voltage from the second terminal voltage, and diagnoses the first switch as having a failure or not on the basis of a comparison result obtained by comparing the close voltage and the open voltage, respectively, with a fourth threshold voltage corresponding to the reference voltage. According to the power supply protective device, by making use of a voltage difference between the first terminal voltage and the second terminal voltage, i.e. a voltage across the first switch, determination is made whether the first switch has a failure or not, which makes it easier to diagnose the first switch as having a failure or not.

(7) The above power supply protective device may be configured such that the control unit diagnoses the first switch as having a closed failure when the open voltage is less than the fourth threshold voltage, and diagnoses the first switch as having an open failure when the close voltage is not less than the fourth threshold voltage. According to the power supply protective device, making use of the open voltage and the close voltage themselves enables occurrence of an open failure or a closed failure in the first switch to be individually diagnosed.

(8) The above power supply protective device may be configured such that the control unit diagnoses the second switch as having an open failure when at least either one of the open voltage and the close voltage is not less than a fifth threshold voltage corresponding to the second terminal voltage, the fifth threshold voltage being higher than the reference voltage. According to the power supply protective device, making use of at least either one of the open voltage and the close voltage enables the second switch to be diagnosed as having an open failure.

(9) The above power supply protective device may be configured such that the control unit obtains a cutoff voltage in a case where the second switch is controlled to be in the open state and the first switch is controlled to be in the open state during discharging of the power supply, and when the cutoff voltage is not less than the fifth threshold voltage, diagnoses the second switch as having no failure, and when the cutoff voltage is less than the fifth threshold voltage, diagnoses the second switch as having a closed failure. According to the power supply protective device, making use of the cutoff voltage in a case where the first switch is controlled to be in the closed state and the second switch is controlled to be in the closed state enables the second switch to be diagnosed as having no failure or the second switch to be diagnosed as having a closed failure.

(10) The above power supply protective device may be configured such that the control unit obtains the cutoff voltage at timing when power supply to the load can be cut off. According to the power supply protective device, an effect exerted on the load by cutoff of a power supply to the load, i.e. by cutoff of a current path between the load and the power supply can be suppressed.

(11) The above power supply protective device may be configured to further include a current detection unit which detects discharge current from the power supply, and configured such that the control unit obtains a discharge current value from the current detection unit and diagnoses at least the first switch as having a failure or not on condition that the discharge current value becomes less than a defined discharge current value. According to the power supply protective device, since a failure of a switch is diagnosed using an open voltage and a close voltage in a case where a discharge current value is less than a defined discharge current value, a failure of a switch can be diagnosed using smaller open voltage and close voltage as compared with a case where the discharge current value is not less than the defined discharge current value.

(12) The above power supply protective device may be configured such that the control unit executes second instruction processing of giving the open instruction to the first switch and giving the close instruction to the second switch on condition that the first switch and the second switch have no open failure, and determines that the first switch has no closed failure when a voltage difference between the first voltage and the second voltage detected by the voltage detection unit during execution of the second instruction processing is not less than the first threshold voltage. In the power supply protective device, determination whether the first switch has a closed failure or not is made on condition that determination is made that the first switch and the second switch have no open failure. Therefore, since even when the second instruction processing is executed of giving an open instruction to the first switch and giving a close instruction to the second switch in order to determine whether the first switch has a closed failure or not, at least the second switch is reliably in the closed state, so that occurrence of a power fail can be suppressed.

(13) The above power supply protective device may be configured such that the control unit executes third instruction processing of giving the close instruction to the first switch and giving the close instruction to the second switch on condition that the first switch is determined not to have a closed failure, and determines that the first switch has no open failure when a voltage difference between the first voltage and the second voltage detected by the voltage detection unit during execution of the third instruction processing is less than the first threshold voltage. According to the power supply protective device, determination can be made after execution of the second instruction processing whether the first switch has an open failure or not.

(14) The above power supply protective device may be configured such that the control unit executes fourth instruction processing of giving the close instruction to the first switch and giving the open instruction to the second switch on condition that the first switch and the second switch are determined to have no open failure, and determines that the second switch has no closed failure when the third voltage detected by the voltage detection unit during execution of the fourth instruction processing is less than the second threshold voltage. In the power supply protective device, determination whether the second switch has a closed failure or not is made on condition that the first switch and the second switch have no open failure. Therefore, since even when the fourth instruction processing is executed of giving a close instruction to the first switch and giving an open instruction to the second switch in order to determine whether the second switch has a closed failure or not, at least the first switch is reliably in the closed state, so that occurrence of a power fail can be suppressed.

(15) The above power supply protective device may be configured such that the control unit executes fifth instruction processing of giving the close instruction to the first switch and giving the close instruction to the second switch on condition that the second switch is determined to have no closed failure, and determines that the second switch has no open failure when the third voltage detected by the voltage detection unit during execution of the fifth instruction processing is not less than the second threshold voltage. In the power supply protective device, determination whether the second switch has an open failure or not can be made after execution of the fourth instruction processing.

(16) The above power supply protective device may be configured to include a ground circuit which has a resistance element and connects a point between the second switch and the voltage drop element to a ground voltage via the resistance element. In the power supply protective device, the third voltage in a case where the second switch is in the open state serves as the ground voltage and the third voltage in a case where the second switch is in the closed state serves as the second voltage. Therefore, a third voltage can be reliably different in a case where the second switch is in the open state from a third voltage in a case where the second switch is in the closed state, so that use of the third voltage enables determination whether the second switch has an open failure or not to be reliably made.

(17) The above power supply protective device may be configured such that the ground circuit has a third switch and the control unit gives the open instruction to the third switch when determining whether the first switch has an open failure or not and/or gives the close instruction to the third switch when determining whether the second switch has an open failure or not. In a case where a point between the second switch and the voltage drop element is constantly connected to the ground voltage via the ground circuit, when the second switch enters the closed state, a current path is formed between the power supply and the ground voltage via the resistance element, so that power accumulated in the power supply is wastefully consumed. In the power supply protective device, the ground circuit has the third switch and when determining whether the second switch has an open failure or not, i.e. when detecting the third voltage, a close instruction is given to the third switch. This enables the point between the second switch and the voltage drop element to be connected to the ground voltage. Additionally, when determination is made whether the first switch has an open failure or not, i.e. when the third voltage is not detected, an open instruction is given to the third switch to cut off the current path between the power supply and the ground voltage via the resistance element. This suppresses power accumulated in the power supply from being wastefully consumed when determination is made whether the first switch has an open failure or not.

(18) The above power supply protective device may be configured such that the voltage drop element is a diode with a current direction from the power supply side toward the load side as a forward direction, and the first threshold voltage is a forward direction voltage of the diode. According to the power supply protective device, making use of the forward direction voltage of the diode enables determination whether the first switch has a failure or not. Since a voltage drop value of the forward direction voltage of the diode is constant, it is easier to determine whether the first switch has a failure or not as compared with a case where the voltage drop value is variable.

(19) The above power supply protective device may be configured to include the current detection unit which detects a discharge current from the power supply, and configured such that the control unit executes the first instruction processing and determines whether the first switch and the second switch have an open failure or not on condition that a current value of the discharge current detected by the current detection unit becomes less than a defined value. According to the power supply protective device, since the voltage detection unit detects a voltage to diagnose a failure of a switch on condition that a current value of the discharge current becomes less than the defined value, a failure of a switch can be diagnosed using a smaller voltage than in detection of a voltage by the voltage detection unit on condition that a current value of the discharge current becomes not less than the defined value.

(20) The above power supply protective device may be configured such that the control unit further determines whether the voltage drop element has a short-circuit failure or an open failure on the basis of a comparison result obtained by comparing the first voltage and the third voltage. According to the power supply protective device, a short-circuit failure or an open failure of the voltage drop element can be diagnosed with ease.

(21) Additionally, a power supply device may be provided to include a power supply and the above power supply protective device.

Hereinafter, battery protective devices according to embodiments of the present invention will be described with reference to the drawings. Each of the embodiments to be described in the following shows one preferred specific example of the present invention. Numerical values, shapes, materials, components, arrangement positions and connection modes of the components, steps in a switch failure diagnosing method, an order of the steps shown in the following embodiments are examples only and are not construed as limiting the present invention. Additionally, among components in the following embodiments, components not recited in independent claims indicating the highest-order concept will be described as arbitrary components.

1A. First Embodiment

1A-1. Configuration of Battery Protective Device

One embodiment will be described with reference to FIG. 1 to FIG. 3. A battery pack 1100 is mounted on, for example, an electric vehicle or a hybrid vehicle (hereinafter, referred to as a vehicle) to supply power to a load 1500 of each of various apparatuses in the vehicle. The battery pack 1100 includes a secondary battery 1200 and a battery protective device 1300. The battery pack 1100 is one example of a power supply device. The secondary battery 1200 is one example of a power supply. The power supply may be a primary battery, a capacitor or the like, and a kind of battery is not limited.

Figure 2:
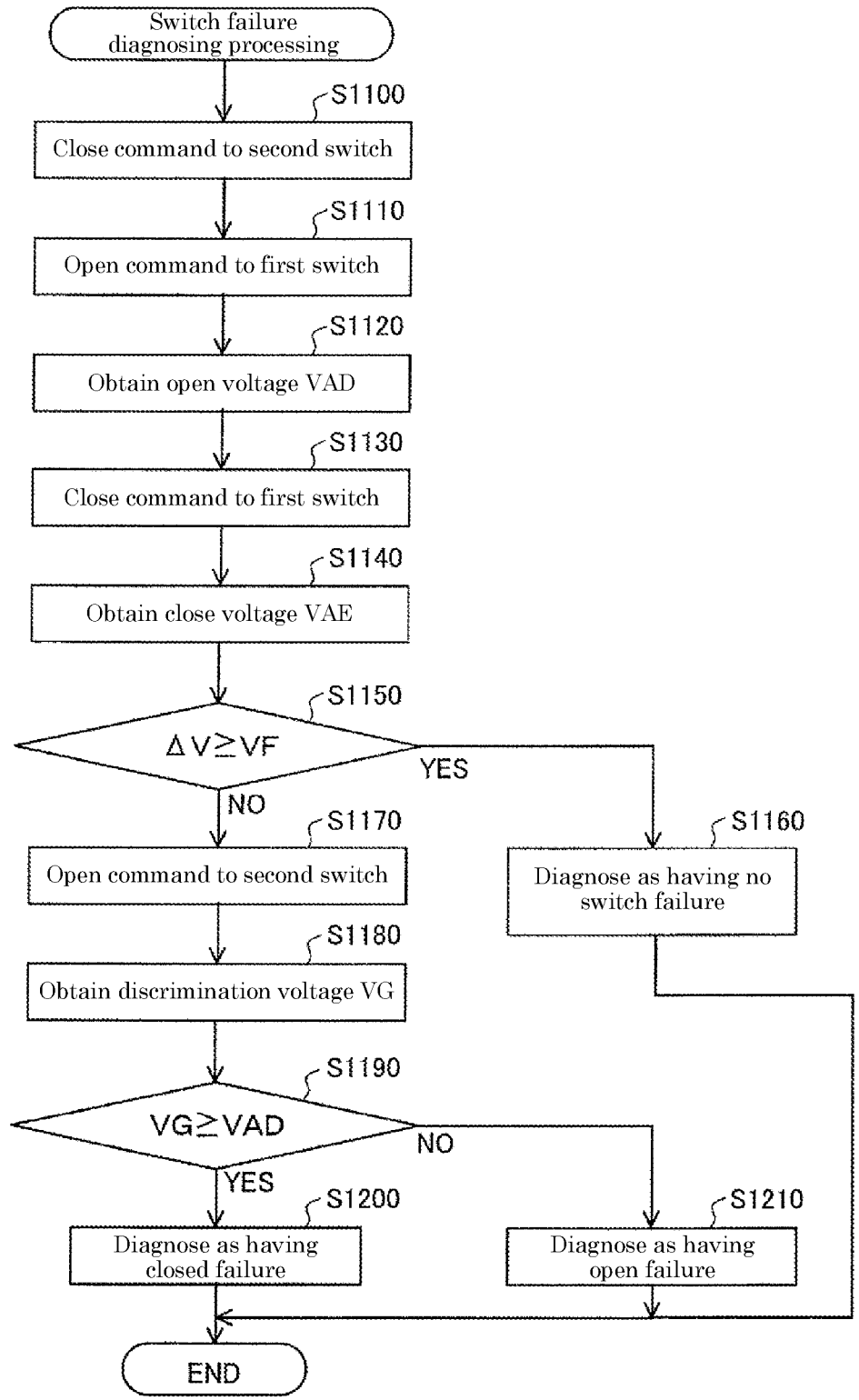
FIG. 2 is a flow chart showing switch failure diagnosing processing according to the first embodiment.

As shown in FIG. 1, the secondary battery 1200 is, for example, a lithium ion battery and is a battery pack in which four cells 1210 are connected in series. A positive electrode side of the secondary battery 1200 is connected to the battery protective device 1300 and a negative electrode side of the secondary battery 1200 is grounded via a ground point T13.

The battery protective device 1300 includes connection terminals T11 and T12, a resistance element R, a first switch 1310, a switching circuit 1320, and a battery monitoring unit

1330. The connection terminal T11 is connected to the load 1500 via a wire 1510, and the connection terminal T12 is connected to the positive electrode side of the secondary battery 1200 via the wire 1510. The load 1500 includes, for example, an electric power steering, an accessory, and the like. The resistance element R is connected between the negative electrode side of the secondary battery 1200 and the ground point T13 via the wire 1510. The connection terminal T11 is one example of a first terminal and the connection terminal T12 is one example of a second terminal.

The first switch 1310 is, for example, a contact relay (mechanical switch) and is connected between the connection terminal T11 and the connection terminal T12. In other words, the first switch 1310 is provided between the load 1500 and the secondary battery 1200. The first switch 1310 includes a magnetic coil, a point of contact, and a power transistor not shown. When the power transistor not shown receives an open command signal from a central processing unit (hereinafter, referred to as a CPU) 1400 to be described later, the power transistor stops current supply to the magnetic coil, so that as a result, due to an electromagnetic effect, the point of contact of the first switch 1310 is mechanically opened (referred to also as "open state").

Additionally, when the power transistor receives a close command signal from the CPU 1400, the power transistor starts current supply to the magnetic coil, so that as a result, due to an electromagnetic effect, the point of contact of the first switch 1310 is mechanically closed (referred to also as "closed state"). Having the first switch 1310 enter the closed state enables power supply to both a load driven during travelling of a vehicle such as, for example, an electric power steering and a load constantly driven such as an accessory. The first switch 1310 is used for supplying power to the load 1500.

The switching circuit 1320 is connected in parallel to the first switch 1310 between the connection terminal T11 and the connection terminal T12. The switching circuit 1320 has a second switch and a diode D. The second switch and the diode D are connected in series between the connection terminal T11 and the connection terminal T12. The diode D is one example of a voltage drop element.

A second switch 1340 is, for example, a field effect transistor. Upon receiving the open command signal, i.e. a gate off signal, from the CPU 1400, the second switch 1340 enters the open state. Additionally, upon receiving the close command signal, i.e. a gate on signal, from the CPU 1400, the second switch 1340 enters the closed state.

The second switch 1340 is limited in an amount of current flow as compared with the first switch 1310. Therefore, even when the second switch 1340 enters the closed state, no power can be supplied to a load driven during travelling of a vehicle such as, for example, an electric power steering. In other words, the second switch 1340 is not used for supplying power to the load 1500 but used for diagnosing a failure of the first switch 1310 as will be described later.

On the other hand, having the second switch 1340 enter the closed state enables power supply only to a load constantly driven such as an accessory. In other words, when at least one of the first switch 1310 and the second switch 1340 enters the closed state, power can be supplied to a constantly driven load to form a current path between the connection terminal T11 and the connection terminal T12.

The diode D is connected to the side of the connection terminal T11 of the switching circuit 1320, i.e. to the load side. The diode D is arranged to be directed from the side of the connection terminal T12 to the side of the connection terminal T11, i.e. directed such that a current direction DR from the side of the secondary battery 1200 to the side of the load 1500 is a forward direction. Therefore, a current flowing through the diode D generates a voltage drop of a forward direction voltage VF across the diode D. Through the diode D, current flows only when the first switch 1310 is in the open state and the second switch 1340 is in the open state. The forward direction voltage VF is one example of a reference voltage and has a fixed value. Additionally, the forward direction voltage VF is one example of a threshold voltage (a third threshold voltage or a fourth threshold voltage).

The battery monitoring unit 1330 includes a voltage detection circuit 1350, a current detection circuit 1370, and a control unit 1360. Upon receiving a detection command signal from the CPU 1400, the voltage detection circuit 1350 outputs a voltage detection signal according to a voltage between the connection terminal T11 and a ground voltage to the CPU 1400. This voltage is equal to a voltage at a terminal on the load 1500 side of the first switch 1310 and is hereinafter referred to as a load side voltage VA. The voltage detection circuit 1350 is one example of a voltage detection unit, and the current detection circuit 1370 is one example of a current detection unit. Additionally, the load side voltage VA is one example of a first terminal voltage.

On the other hand, in the present embodiment, the voltage detection circuit 1350 fails to have a configuration for detecting a voltage between the connection terminal T12 and the ground voltage, i.e. a power supply side voltage VB as a voltage at a terminal on the secondary battery 1200 side of the first switch 1310. Therefore, the voltage detection circuit 1350 fails to calculate a voltage ΔVAB across the first switch 1310 by subtracting the load side voltage VA from the power supply side voltage VB. The power supply side voltage VB is one example of a second terminal voltage and is larger than the forward direction voltage VF. Additionally, the power supply side voltage VB is one example of a second threshold voltage (a fifth threshold voltage).

The current detection circuit 1370 detects a charge current or a discharge current (hereinafter, referred to as a charge/discharge current) of the secondary battery 1200 in each predetermined period. Specifically, the current detection circuit 1370 detects a current value flowing through a resistance element R to output a current detection signal according to the detected current value of the charge/discharge current to the CPU 1400.

The control unit 1360 has the CPU 1400 and a memory 1410. The memory 1410 is configured with, for example, a RAM or a ROM, in which various programs are stored. The CPU 1400 controls each unit of the battery monitoring unit 1330 according to a program read from the memory 1410. For example, the CPU 1400 transmits the open command signal and the close command signal to the first switch 1310 and the second switch 1340 to control switching of the first switch 1310 and the second switch 1340. Additionally, the CPU 1400 transmits the detection instruction signal to the voltage detection circuit 1350 to obtain the voltage detection signal output from the voltage detection circuit 1350. The CPU 1400 executes switch failure diagnosing processing to be described later using the voltage detection signal obtained from the voltage detection circuit 1350.

1A-2. Switch Failure Diagnosing Processing

Next, a specific flow of the switch failure diagnosing processing will be described with reference to FIG. 2 and FIG. 3. Regarding the switch failure diagnosing processing of the present embodiment, description will be made of a diagnosis of a switch failure of the first switch 1310. The switch failure diagnosing processing of the present embodiment is premised on that the second switch 1340 is normal. This is because the second switch 1340 is not used for supplying power to the load 1500 and is highly unlikely to develop a switch failure as compared with the first switch 1310. The switch failure diagnosing processing is executed at a time, during discharging from the secondary battery 1200 to the load 1500, after a lapse of a reference time after, for example, execution of the previous switch failure diagnosing processing, when a current value of the charge/discharge current detected by the current detection circuit 1370 becomes less than a defined discharge current value set in advance.

A switch failure includes an open failure and a closed failure. The open failure is a failure in which even receiving the close command signal, the first switch 1310 remains in the open state due, for example, to a failure of a coil which drives the first switch 1310, or the like. Additionally, the closed failure is a failure in which even receiving the open command signal, the first switch 1310 remains in the closed state due to, for example, welding of the point of contact of the first switch 1310 or the like.

In the switch failure diagnosing processing of the present embodiment, first, the first switch 1310 is diagnosed as having a switch failure or not and when the first switch 1310 is diagnosed as having a switch failure, the developed switch failure is diagnosed as being either an open failure or a closed failure.

After starting the switch failure diagnosing processing, the CPU 1400 transmits the close command signal to the second switch 1340 (S1100), and transmits the open command signal to the first switch 1310 (S1110). The CPU 1400 obtains an open voltage VD in a case where the first switch 1310 is in the open state and the second switch 1340 is in the closed state (S1120). In the present embodiment, since the voltage detection circuit 1350 detects only the load side voltage VA, the open voltage VD is shown as an open voltage VAD which is the open voltage VD of the load side voltage VA.

Next, the CPU 1400 transmits the close command signal to the first switch 1310 (S1130), and obtains a close voltage VAE in a case where both the first switch 1310 and the second switch 1340 are in the closed state (S1140). The CPU 1400 calculates a voltage difference ΔV by subtracting the open voltage VAD from the close voltage VAE and compares the voltage difference ΔV with the forward direction voltage VF (the third threshold voltage) (S1150). The voltage difference ΔV is one example of a difference voltage.

As shown in FIG. 3, when the first switch 1310 has no switch failure, i.e. is normal, the voltage difference ΔV becomes equal to the forward direction voltage VF, and when the first switch 1310 has a switch failure, the voltage difference ΔV attains zero. When the voltage difference ΔV is not less than the forward direction voltage VF (S1150: YES), the CPU 1400 diagnoses the first switch 1310 as having no switch failure (S1160) to end the switch failure diagnosing processing.

On the other hand, when the voltage difference ΔV is less than the forward direction voltage VF (S1150: NO), the CPU 1400 diagnoses the first switch 1310 as having a switch failure, either an open failure or a closed failure.

In this case, the CPU 1400 further transmits the open command signal to the second switch 1340 (S1170) to obtain a discrimination voltage VG as the load side voltage VA in a case where the first switch 1310 is in the closed state and the second switch 1340 is in the open state (S1180). The CPU 1400 compares the obtained discrimination voltage VG with the open voltage VAD (S1190).

As shown in FIG. 3, when the first switch 1310 has an open failure, the discrimination voltage VG attains zero, which is less than the open voltage VAD as a value obtained by subtracting the forward direction voltage VF from the power supply side voltage VB. Additionally, when the first switch 1310 has a closed failure, the discrimination voltage VG becomes equal to the power supply side voltage VB and becomes equal also to the open voltage VAD. When the discrimination voltage VG is not less than the open voltage VAD (S1190: YES), the CPU 1400 diagnoses the first switch 1310 as having a closed failure (S1200) to end the switch failure diagnosing processing.

On the other hand, when the discrimination voltage VG is less than the open voltage VAD (S1190: NO), the CPU 1400 diagnoses the first switch 1310 as having an open failure (S1210) to end the switch failure diagnosing processing.

As described in the foregoing, in the present embodiment, at the time of diagnosing a switch failure of the first switch 1310, the second switch 1340 is controlled to be in the closed state to obtain the open voltage VAD and the close voltage VAE. Therefore, during discharging from the secondary battery 1200 to the load 1500, cutoff of a current path between the secondary battery 1200 and the load 1500 can be suppressed.

In the present embodiment, with the diode D connected in series to the second switch 1340, when the first switch 1310 has no switch failure, a voltage difference of the forward direction voltage VF is generated between the open voltage VAD and the close voltage VAE. Assuming that the diode D is not connected to the second switch 1340, even when the first switch 1310 has no switch failure, only a slight voltage difference is generated between the open voltage VAD and the close voltage VAE derived from a slight reduction in an electrical resistance due to an increase in current paths caused by the first switch 1310 entering the closed state. For detecting the voltage difference, a flow of a large current to the first switch 1310 and the second switch 1340 is required, which limits a chance of diagnosing a switch failure of the first switch 1310.

In the present embodiment, with the diode D connected in series to the second switch 1340, a voltage difference of the forward direction voltage VF is generated between the open voltage VAD and the close voltage VAE. Therefore, a switch failure of the first switch 1310 can be diagnosed without making a large current flow to the first switch 1310 and the second switch 1340. Therefore, even when a current value of the charge/discharge current from the secondary battery 1200 is less than the defined discharge current value, a switch failure of the first switch 1310 can be diagnosed.

Since the diode D causes the forward direction voltage VF in the forward direction when current flows, a voltage difference can be easily generated. Additionally, since the diode D is arranged such that a direction from the side of the secondary battery 1200 to the side of the load 1500 is the forward direction, when a charger is connected in place of the load 1500, charging of the secondary battery 1200 via the second switch 1340 is prevented.

Additionally, since the diode D is connected in series to the second switch 1340, the forward direction voltage VF of the diode D suppresses a large current from flowing to the second switch 1340. Therefore, it is not necessary to use a large current relay such as a contact relay as the second switch 1340, and therefore, the switching circuit 1320 can be configured using such a small current switch as a field-effect transistor.

In the present embodiment, the voltage detection circuit 1350 detects only the load side voltage VA, and neither detects the power supply side voltage VB nor calculates the end-to-end voltage ΔVAB. Therefore, as compared with a case where the power supply side voltage VB is detected to calculate the end-to-end voltage ΔVAB, the configuration of the voltage detection circuit 1350 can be simplified, and the processing of the CPU 1400 in the switch failure diagnosing processing can be simplified.

In the present embodiment, by comparing, with the forward direction voltage VF, a voltage difference ΔV between the open voltage VAD and the close voltage VAE, the difference being detected with the second switch 1340 in the closed state, the first switch 1310 can be diagnosed as having either one of an open failure and a closed failure.

Further, when the first switch 1310 is diagnosed as having either one of an open failure and a closed failure, by comparing, with the open voltage VAD, the discrimination voltage VG in a case where the first switch 1310 is controlled to be in the closed state and the second switch 1340 is controlled to be in the open state, a kind of a failure developed in the first switch 1310 can be diagnosed.

1B. Other Embodiment

Figure 4:
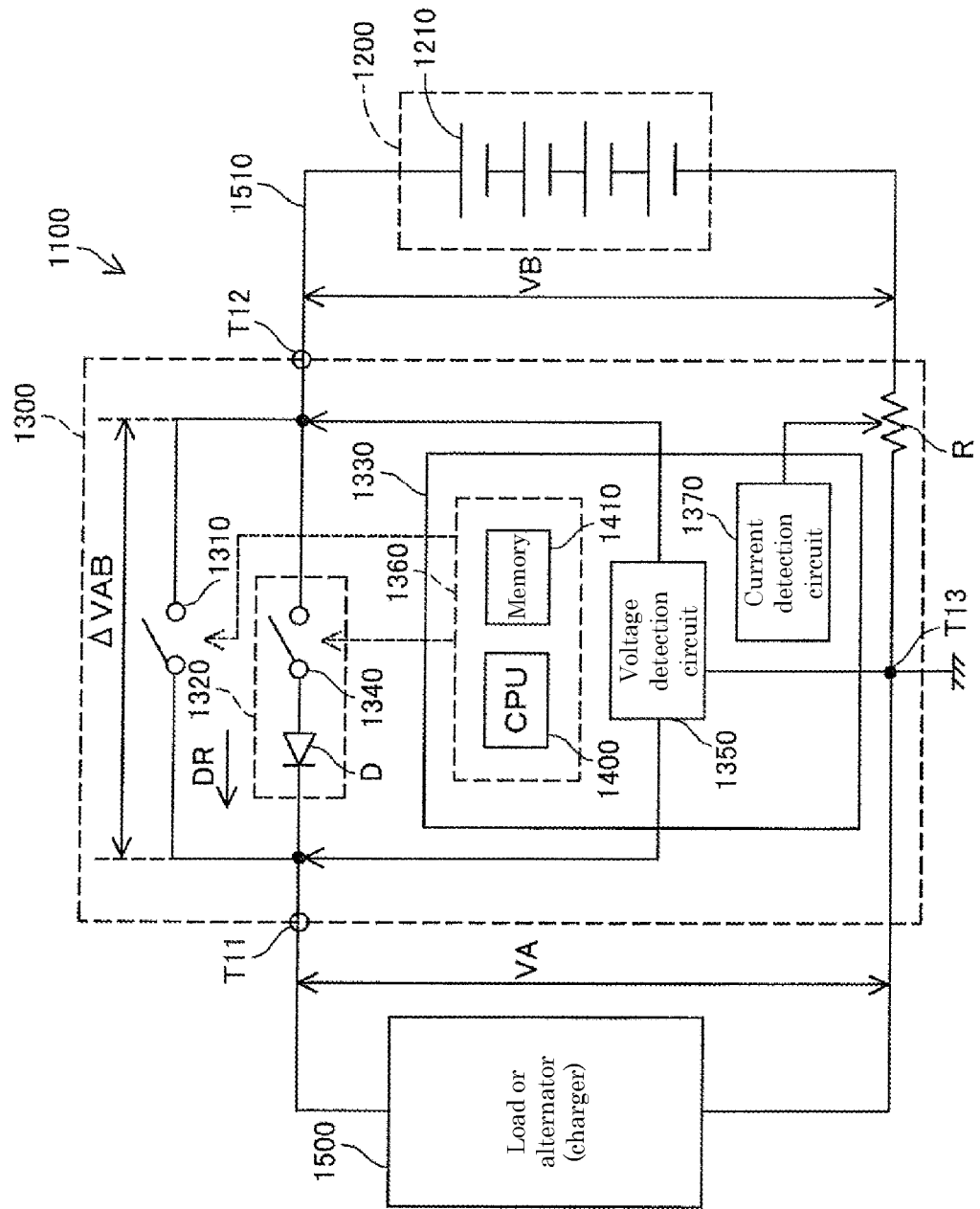
FIG. 4 is a block diagram showing an electrical configuration of the battery protective device according to the first embodiment.
Figure 5:
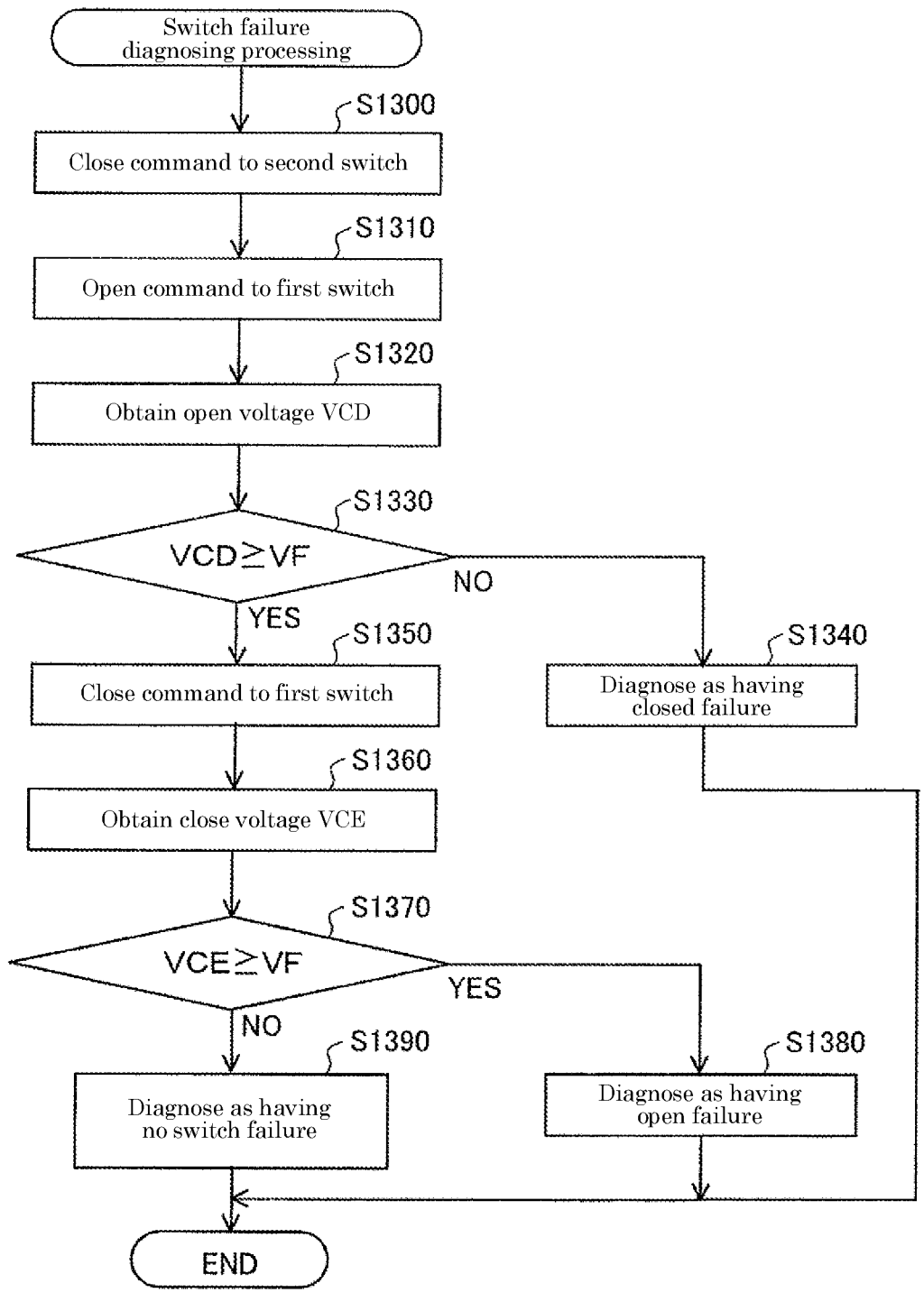
FIG. 5 is a flow chart showing the switch failure diagnosing processing according to the first embodiment.

Other embodiment is shown in FIG. 4 to FIG. 6. A difference from the above-described embodiment shown in FIG. 1 to FIG. 3 is that as shown in FIG. 5, the voltage detection circuit 1350 is configured to detect both the load side voltage VA and the power supply side voltage VB, and the CPU 1400 executes the switch failure diagnosing processing using the end-to-end voltage ΔVAB as a difference voltage between the load side voltage VA and the power supply side voltage VB, and the remainder is the same as the embodiment shown in FIG. 1 to FIG. 3. Accordingly, the same reference signs as those of the embodiment shown in FIG. 1 to FIG. 3 are allotted hereinafter to omit description of overlaps and to make description only of the difference.

A specific flow of the switch failure diagnosing processing of the present embodiment will be described with reference to FIG. 5 and FIG. 6. In the switch failure diagnosing processing of the present embodiment, whether the first switch 1310 has an open failure and whether the switch has a closed failure are diagnosed individually.

When starting the switch failure diagnosing processing, the CPU 1400 transmits the close command signal to the second switch 1340 (S1300) and transmits the open command signal to the first switch 1310 (S1310). The CPU 1400 obtains an open voltage VD in a case where the first switch 1310 is in the open state and the second switch 1340 is in the closed state (S1320). In the present embodiment, since the voltage detection circuit 1350 detects both the load side voltage VA and the power supply side voltage VB, the CPU 1400 obtains the load side voltage VA and the power supply side voltage VB in a case where the first switch 1310 is in the open state and the second switch 1340 is in the closed state, and obtains, as an open voltage VCD, an end-to-end voltage ΔVAB calculated from the obtained load side voltage VA and power supply side voltage VB. The CPU 1400 compares the obtained open voltage VCD and the forward direction voltage VF (the fourth threshold voltage) (S1330).

As shown in FIG. 6, when the first switch 1310 has no switch failure, i.e. is normal, or when the first switch 1310 has an open failure, the open voltage VCD becomes equal to the forward direction voltage VF. Additionally, when the first switch 1310 has a closed failure, the open voltage VCD attains zero. When the open voltage VCD is less than the forward direction voltage VF (S1330: NO), the CPU 1400 diagnoses the first switch 1310 as having a closed failure (S1340) to end the switch failure diagnosing processing.

On the other hand, when the open voltage VCD is not less than the forward direction voltage VF (S1330: YES), the CPU 1400 transmits the close command signal to the first switch 1310 (S1350), and obtains a close voltage VCE in a case where the first switch 1310 is in the closed state and the second switch 1340 is in the closed state (S1360). The CPU 1400 obtains the load side voltage VA and the power supply side voltage VB in a case where the first switch 1310 is in the closed state and the second switch 1340 is in the closed state, and obtains, as the close voltage VCE, an end-to-end voltage ΔVAB calculated from the obtained load side voltage VA and power supply side voltage VB. The CPU 1400 compares the obtained close voltage VCE with the forward direction voltage VF (the fourth threshold voltage) (S1370).

As shown in FIG. 6, when the first switch 1310 has no switch failure, the close voltage VCE attains zero, and when the first switch 1310 has an open failure, the close voltage VCE becomes equal to the forward direction voltage VF. When the close voltage VCE is not less than the forward direction voltage VF (S1370: YES), the CPU 1400 diagnoses the first switch 1310 as having an open failure (S1380) to end the switch failure diagnosing processing.

On the other hand, when the close voltage VCE is less than the forward direction voltage VF (S1370: NO), the CPU 1400 diagnoses the first switch 1310 as having no switch failure (S1390) to end the switch failure diagnosing processing.

As described in the foregoing, in the present embodiment, determination whether the first switch 1310 has a failure or not is made using the open voltage VCD and the close voltage VCE of the end-to-end voltage ΔVAB across the first switch 1310. Therefore, as compared with a case where only the load side voltage VA of the first switch 1310 is detected, the number of steps of the processing required for a diagnosis of a failure of a switch can be reduced to enable whether the first switch has a failure or not to be diagnosed with ease.

The present embodiment enables the battery protective device 1300 to diagnose whether the first switch 1310 has an open failure or not using only the open voltage VCD detected with the second switch 1340 in the closed state. Additionally, it is possible to diagnose the first switch 1310 as having a closed failure using only the close voltage VCE detected with the second switch 1340 in the closed state.

1C. Modification

The techniques recited in the present specification are not limited to the above first embodiment, but can be modified in various forms without departing from a scope thereof, and allows for, for example, the following modifications. For example, although in the above embodiment, the battery monitoring unit 1330 is configured to have one CPU 1400, the configuration of the battery monitoring unit 1330 is not limited thereto and may be configured to include a plurality of CPUs, configured to include such a hardware circuit as an ASIC (Application Specific Integrated Circuit) or configured to include both a hardware circuit and a CPU.

Additionally, although in the above embodiment, the battery pack 1100 includes one battery protective device 1300, a plurality of battery protective devices 1300 may be provided. Additionally, although in the above embodiment, the secondary battery 1200 includes a plurality of cells 1210 connected in series, only one cell may be provided or a plurality of cells connected in parallel may be provided.

Additionally, in the above embodiment, a contact relay is recited as an example of the first switch 1310. However, the first switch 1310 is not limited thereto, but may be, for example, a semiconductor element such as a bipolar transistor or a MOSFET.

Additionally, in the above embodiment, the configuration is recited which includes a magnetic coil, a point of contact, and a power transistor as an example of the first switch 1310. However, the configuration of the first switch 1310 is not limited thereto, but may be replaced with other configuration when it is not necessary to include at least one of these components, and for example, the first switch 1310 may be configured to directly receive an open command signal or a close command signal from the CPU 1400 without including a power transistor.

Additionally, the above embodiment has a configuration in which the diode D is connected in series to the second switch 1340. However, an element connected in series to the second switch 1340 is not limited thereto, but may be a resistance element having high resistivity, for example, a resistance element having a resistance value of about 1 MΩ.

Additionally, in the above embodiment, the example is recited in which when power is supplied from the secondary battery 1200 to the load 1500, while maintaining power supply to the load 1500, a switch failure of the first switch 1310 is diagnosed. However, not limited thereto, but in a case where power is supplied from the alternator (charger) 1500 to the secondary battery 1200, a switch failure of the first switch 1310 may be diagnosed while maintaining power supply to the secondary battery 1200. In this case, the battery protective device 1300 has the following configuration.

A power supply protective device includes a first switch provided between a first terminal to which at least one of a load and a charger is connected and a second terminal to which a power supply is connected; a switching circuit connected in parallel to the first switch and including a second switch and a voltage drop element connected in series to the second switch and causing a voltage drop of a reference voltage by a current flow; a voltage detection unit which detects at least a voltage of the second terminal; and a control unit which controls switching of the first switch and the second switch to obtain a voltage from the voltage detection unit, in which the control unit obtains an open voltage in a case where the second switch is brought into the closed state and the first switch is brought into the open state during charging of the power supply, obtains a close voltage in a case where the second switch is brought into the closed state and the first switch is brought into the closed state during charging of the power supply, and diagnoses the first switch as having a failure or not on the basis of the open voltage and the close voltage.

Since in the power supply protective device, when a failure of the first switch is diagnosed, the second switch is controlled to be in the closed state to obtain an open voltage and a close voltage, cutoff of a current path between the charger and the power supply is suppressed during charging of the power supply. Additionally, the voltage drop element is connected in series to the second switch, and when the first switch has no failure, a voltage difference of the reference voltage is generated between an open voltage and a close voltage. Therefore, use of this voltage difference enables determination whether the first switch has a failure or not on the basis of the open voltage and the close voltage.

In the above case, the diode D connected in series to the second switch 1340 is arranged to have a forward direction thereof disposed reverse to the current direction DR. Additionally, along with a change on the power supply side, the load side voltage VA is read on the power supply side voltage VB and the power supply side voltage VB is read on a charger side voltage VA.

In the above embodiment, the forward direction voltage VF and the open voltage VAD are recited as determination criteria at the time of diagnosing a switch failure of the first switch 1310. However, these voltages may be appropriately increased or decreased taking into consideration of, for example, effects of a resistance, noise and the like of the wire 1510. For example, a half value of each of these voltages may be used as a determination criterion.

Additionally, in the above embodiment, a switch failure of the first switch 1310 is diagnosed assuming that the second switch 1340 is normal. However, not limited thereto, but switch failures of the first switch 1310 and the second switch 1340 may be diagnosed. Switch failure diagnosing processing of diagnosing switch failures of the first switch 1310 and the second switch 1340 is approximately the same as that of other embodiment, with a difference being in determination whether a switch failure develops or not.

As shown in FIG. 7, when the first switch 1310 has a closed failure, the open voltage VCD attains zero. When the first switch 1310 has a closed failure, whether the second switch 1340 has a switch failure or not cannot be diagnosed.

On the other hand, in a case where the first switch 1310 has no switch failure, i.e., is normal, or in a case where the first switch 1310 has an open failure, when the second switch 1340 has an open failure, the open voltage VCD becomes equal to the power supply side voltage VB, and when the second switch 1340 is normal, or when the second switch 1340 has a closed failure, the open voltage VCD becomes equal to the forward direction voltage VF.

Additionally, as shown in FIG. 7, when the first switch 1310 has no switch failure, i.e., is normal, the close voltage VCE attains zero. On the other hand, in a case where the first switch 1310 has an open failure, when the second switch 1340 has an open failure, the close voltage VCE becomes equal to the power supply side voltage VB, and when the second switch 1340 is normal, or when the second switch 1340 has a closed failure, the close voltage VCE becomes equal to the forward direction voltage VF.

Therefore, the CPU 1400 is allowed to diagnose the second switch 1340 as having an open failure when at least one of the open voltage VCD and the close voltage VCE is not less than the power supply side voltage VB. On the other hand, the CPU 1400 is not allowed to diagnose the second switch 1340 as being normal or the second switch 1340 as having an open failure when at least one of the open voltage VCD and the close voltage VCE is not less than the forward direction voltage VF and is less than the power supply side voltage VB.

From the foregoing results, diagnoses are made of the following states.

(1) In a case where the first switch has a closed failure.

(2) In a case where the first switch is normal and the second switch has an open failure.

(3) In a case where the first switch has an open failure and the second switch has an open failure.

Then, diagnoses are yet to be made of the following states.

(4) In a case where the first switch is normal and the second switch is normal.

(5) In a case where the first switch is normal and the second switch has a closed failure.

(6) In a case where the first switch has an open failure and the second switch is normal.

(7) In a case where the first switch has an open failure and the second switch has a closed failure.

The above states of (4) to (7) can be diagnosed when a current path between the secondary battery 1200 and the load 1500 may be cut off during discharging from the secondary battery 1200 to the load 1500.

FIG. 7 shows the cutoff voltage VH as an end-to-end voltage ΔVAB in a case where the first switch 1310 is in the open state and the second switch 1340 is in the open state. The CPU 1400 obtains the cutoff voltage VH at time allowed to cut off power supply to the load 1500. Timing allowed to cut off power supply to the load 1500 is, for example, timing when the alternator operates to supply power such as timing of travelling. In this case, even when the power supply is cut off for several seconds required for obtaining the cutoff voltage VH due to power supply from the alternator, operation is not affected.

As shown in FIG. 7, when the second switch 1340 is normal, the cutoff voltage VH becomes not less than the power supply side voltage VB, and when the second switch 1340 has a closed failure, the cutoff voltage VH becomes equal to the forward direction voltage VF, i.e., becomes less than the power supply side voltage VB. Specifically, comparison between the cutoff voltage VH detected with both the first switch 1310 and the second switch 1340 set to the closed state and the power supply side voltage VB enables the second switch 1340 to be diagnosed as being normal or having a closed failure, and as a result, the states of (4) to (7) can be diagnosed.

2A. Second Embodiment 2A-1. Configuration of Battery Protective Device

Description will be made of a battery pack 2100 according to one embodiment with reference to FIG. 8 to FIG. 13. The battery pack 2100 is mounted on, for example, an electric vehicle or a hybrid vehicle (hereinafter, referred to as a vehicle) or mounted for starting an engine (a conventional lead storage battery) of a vehicle to supply power to a load 2500 of each of various apparatuses in the vehicle. The battery pack 2100 includes a secondary battery 2200 and a battery protective device 2300. The battery pack 2100 is one example of a power supply device. The secondary battery 2200 is one example of a power supply and may be a primary battery or a capacitor or the like. The battery protective device 2300 is one example of a power supply protective device.

Figure 8:
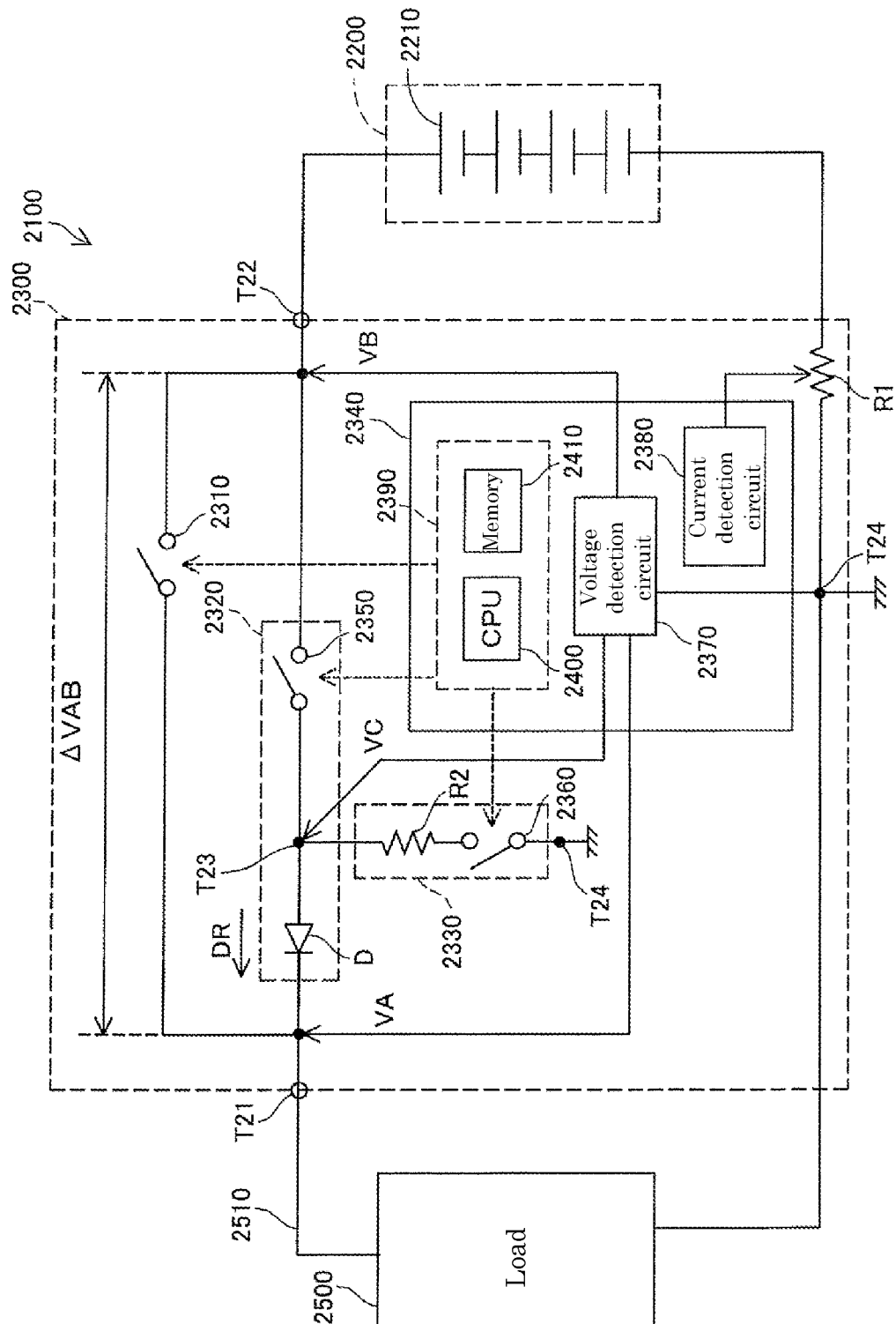
FIG. 8 is a block diagram showing an entire configuration of a battery pack according to a second embodiment.

FIG. 8 is a block diagram showing an entire configuration of the battery pack 2100. As shown in FIG. 8, the secondary battery 2200 is, for example, a lithium ion battery, and is a battery pack including a plurality of cells 2210 (four in FIG. 8) connected in series. A positive electrode side of the secondary battery 2200 is connected to the battery protective device 2300, and a negative electrode side of the secondary battery 2200 is connected to a ground voltage via a ground point T24.

The battery protective device 2300 includes connection terminals T21 and T22, a resistance element R1, a first switch 2310, a switching circuit 2320, a ground circuit 2330, and a battery monitoring unit 2340. The connection terminal T21 is connected to the load 2500 via a wire 2510, and the connection terminal T22 is connected to the positive electrode side of the secondary battery 2200 via the wire 2510. The load 2500 includes, for example, an electric power steering, an accessory, and the like. The resistance element R1 is connected between the negative electrode side of the secondary battery 2200 and the ground point T24 via the wire 2510. Similarly to T11, the connection terminal T21 is one example of a first terminal and similarly to T12, the connection terminal T22 is one example of a second terminal.

Since the first switch 2310 and a second switch 2350 are the same as the first switch 1310 and the second switch 1340 in the first embodiment, no description will be made of detailed configurations thereof.

The diode D is connected to the connection terminal T21 side of the second switch 2350, i.e. to the load side. Since details of the diode D are the same as those of the first embodiment, no description will be made thereof. A forward direction voltage VF is one example of a first threshold voltage.

The ground circuit 2330 is connected between a middle point T23 between the second switch 2350 of the switching circuit 2320 and the diode D, and the ground point T24. The ground circuit 2330 has a third switch 2360 and a resistance element R2. The third switch 2360 and the resistance element R2 are connected in series between the middle point T23 and the ground point T24. The middle point T23 is one example of a point between a second switch and a voltage drop element.

The third switch 2360 is, for example, a field-effect transistor. When receiving an open instruction signal from a CPU 2400, the third switch 2360 enters an open state. Additionally, when receiving a close instruction signal from the CPU 2400, the third switch 2360 enters a closed state. The resistance element R2 is connected to the middle point T23 side of the third switch 2360. The ground circuit 2330 connects the middle point T23 to a ground voltage via the ground point T24 when the third switch 2360 enters the closed state.

The battery monitoring unit 2340 includes a voltage detection circuit 2370, a current detection circuit 2380, and a control unit 2390 which are the same as the voltage detection circuit 1350, the current detection circuit 1370, and the control unit 1360 in the first embodiment, respectively. Thus, since the battery monitoring unit 2340 is the same as the battery monitoring unit 1330 in the first embodiment, no detailed description will be made thereof. A load side voltage VA is one example of a first voltage.

Additionally, when receiving a detection instruction signal from the CPU 2400, the voltage detection circuit 2370 outputs a voltage detection signal according to a voltage between the connection terminal T22 and the ground voltage to the CPU 2400. This voltage is equal to a voltage of each terminal of the first switch 2310 and the second switch 2350 on the secondary battery 2200 side, and is hereinafter referred to as a power supply side voltage VB. The power supply side voltage VB is one example of a second voltage.

Further, when receiving the detection instruction signal from the CPU 2400, the voltage detection circuit 2370 outputs the voltage detection signal according to a voltage between the middle point T23 and the ground voltage to the CPU 2400. This voltage is equal to a voltage of a terminal of the second switch 2350 on the load 2500 side, and is hereinafter referred to as an intermediate voltage VC. The intermediate voltage VC is one example of a third voltage.

Since the current detection circuit 2380 is the same as the current detection circuit 1370 in the first embodiment, no detailed description will be made thereof.

The control unit 2390 has the CPU 2400 and a memory 2410 which are the same as the CPU 1400 and the memory 1410 in the first embodiment, respectively. Thus, since the control unit 2390 is the same as the control unit 1360 in the first embodiment, no detailed description will be made thereof. Using the voltage detection signal obtained from the voltage detection circuit 2370, the CPU 2400 diagnoses switch failures of the first switch 2310 and the second switch 2350.

2A-2. Switch Failure Diagnosing Method

Next, a switch failure diagnosing method will be described. A switch failure includes an open failure and a closed failure. Here, "an open failure" represents a failure in which a switch fails to enter the closed state and remains in the open state even when given a close instruction, for example, a failure of a magnetic coil which drives the first switch 2310. Therefore, an open failure of the first switch 2310 is diagnosed with the close instruction signal being transmitted to the first switch 2310. Additionally, "a closed failure" represents a failure in which a switch fails to enter the open state and remains in the closed state even when given an open instruction, for example, a failure developed when a point of contact of the first switch 2310 welds. Therefore, a closed failure of the first switch 2310 is diagnosed with the open instruction signal being transmitted to the first switch 2310. This is also the case with the second switch 2350.

When a closed failure of the first switch 2310 is diagnosed, the open instruction signal is transmitted to the first switch 2310, and the close instruction signal is transmitted to the second switch 2350 as well in order to suppress occurrence of a power fail. However, even when the close instruction signal is transmitted to the second switch 2350, if the second switch 2350 has an open failure, a power fail cannot be suppressed from occurring. Therefore, a diagnosis of a closed failure of the first switch 2310 is conducted after a diagnosis of an open failure of the second switch 2350. Similarly, a diagnosis of a closed failure of the second switch 2350 is conducted after a diagnosis of an open failure of the first switch 2310.

As in a conventional technique, with the close instruction signal being transmitted to the first switch 2310 and the open instruction signal being transmitted to the second switch 2350, when an open failure of the first switch 2310 is diagnosed, if the first switch 2310 has an open failure, a power fail cannot be suppressed from occurring. Similarly, with the open instruction signal being transmitted to the first switch 2310 and the close instruction signal being transmitted to the second switch 2350, when an open failure of the second switch 2350 is diagnosed, if the second switch 2350 has an open failure, a power fail cannot be suppressed from occurring.

FIG. 13 is a table of failure diagnoses of the first switch 2310 and the second switch 2350 according to the present embodiment. As shown in FIG. 13, in the present embodiment, with the close instruction signal being transmitted to the first switch 2310 and the second switch 2350, open failures of the first switch 2310 and the second switch 2350 are diagnosed. In this case, there is a possibility that the following four states are realized.

(Pattern 1) the first switch 2310: in the closed state (not having an open failure), the second switch 2350: in the closed state (not having an open failure);

(Pattern 2) the first switch 2310: in the open state (having an open failure), the second switch 2350: in the closed state (not having an open failure);

(Pattern 3) the first switch 2310: in the closed state (not having an open failure), the second switch 2350: in the open state (having an open failure); and (Pattern 4) the first switch 2310: in the open state (having an open failure), the second switch 2350: in the open state (having an open failure).

It is rare that as in the Pattern 4, the first switch 2310 and the second switch 2350 simultaneously have an open failure. In the Patterns 1 to 3, since at least one of the first switch 2310 and the second switch 2350 is in the closed state, a current path can be ensured between the secondary battery 2200 and the load 2500 via the above one switch. Then, use of the load side voltage VA, the power supply side voltage VB, and the intermediate voltage VC obtained from the voltage detection circuit 2370 enables determination which of the Patterns 1 to 3, the first switch 2310 and the second switch 2350 have. This enables suppression of a power fail to diagnose open failures of the first switch 2310 and the second switch 2350.

Additionally, in the present embodiment, closed failures of the first switch 2310 and the second switch 2350 are diagnosed on condition that the first switch 2310 and the second switch 2350 are diagnosed as having no open failure. For example, a closed failure of the first switch 2310 is diagnosed with the open instruction signal being transmitted to the first switch 2310 and the close instruction signal being transmitted to the second switch 2350. In this case, there is a possibility that the following four states are realized.

(Pattern 5) the first switch 2310: in the open state (not having a closed failure), the second switch 2350: in the closed state (not having an open failure);

(Pattern 6) the first switch 2310: in the closed state (having a closed failure), the second switch 2350: in the closed state (not having an open failure);

(Pattern 7) the first switch 2310: in the open state (not having a closed failure), the second switch 2350: in the open state (having an open failure); and (Pattern 8) the first switch 2310: in the closed state (having a closed failure), the second switch 2350: in the open state (having an open failure).

In the present embodiment, since a closed failure of the first switch 2310 is diagnosed on condition that the first switch 2310 and the second switch 2350 are diagnosed as having no open failure, none of the Patterns 7 and 8 appear. In the Patterns 5 and 6, since at least the second switch 2350 is in the closed state, a current path can be ensured between the secondary battery 2200 and the load 2500 via the second switch 2350. Then, use of the load side voltage VA and the power supply side voltage VB obtained from the voltage detection circuit 2370 enables determination which of the Patterns 5 and 6, the first switch 2310 and the second switch 2350 have. This enables suppression of a power fail to diagnose a closed failure of the first switch 2310. This is also the case with a diagnosis of a closed failure of the second switch 2350.

2A-3. Switch Failure Diagnosing Processing

Next, a specific flow of the switch failure diagnosing processing will be described with reference to FIG. 9 to FIG. 13. In the present embodiment, description will be made of the switch failure diagnosing processing of diagnosing switch failures of the first switch 2310 and the second switch 2350. The switch failure diagnosing processing of the present embodiment is premised on that the third switch 2360 has no failure. This is because the third switch 2360 is not used for supplying power to the load 2500 and is highly unlikely to develop a switch failure as compared with the first switch 2310 and the second switch 2350. Additionally, another reason is, as will be described later, that because the third switch 2360 is given the close instruction signal in a period of detecting the intermediate voltage VC by the voltage detection circuit 2370 and given the open instruction signal in a period of detecting no intermediate voltage VC, the number of times of switching of the third switch between the open state and the closed state is smaller as compared with the first switch 2310 and the second switch 2350 to have an extremely low probability of having a switch failure.

Figure 9:
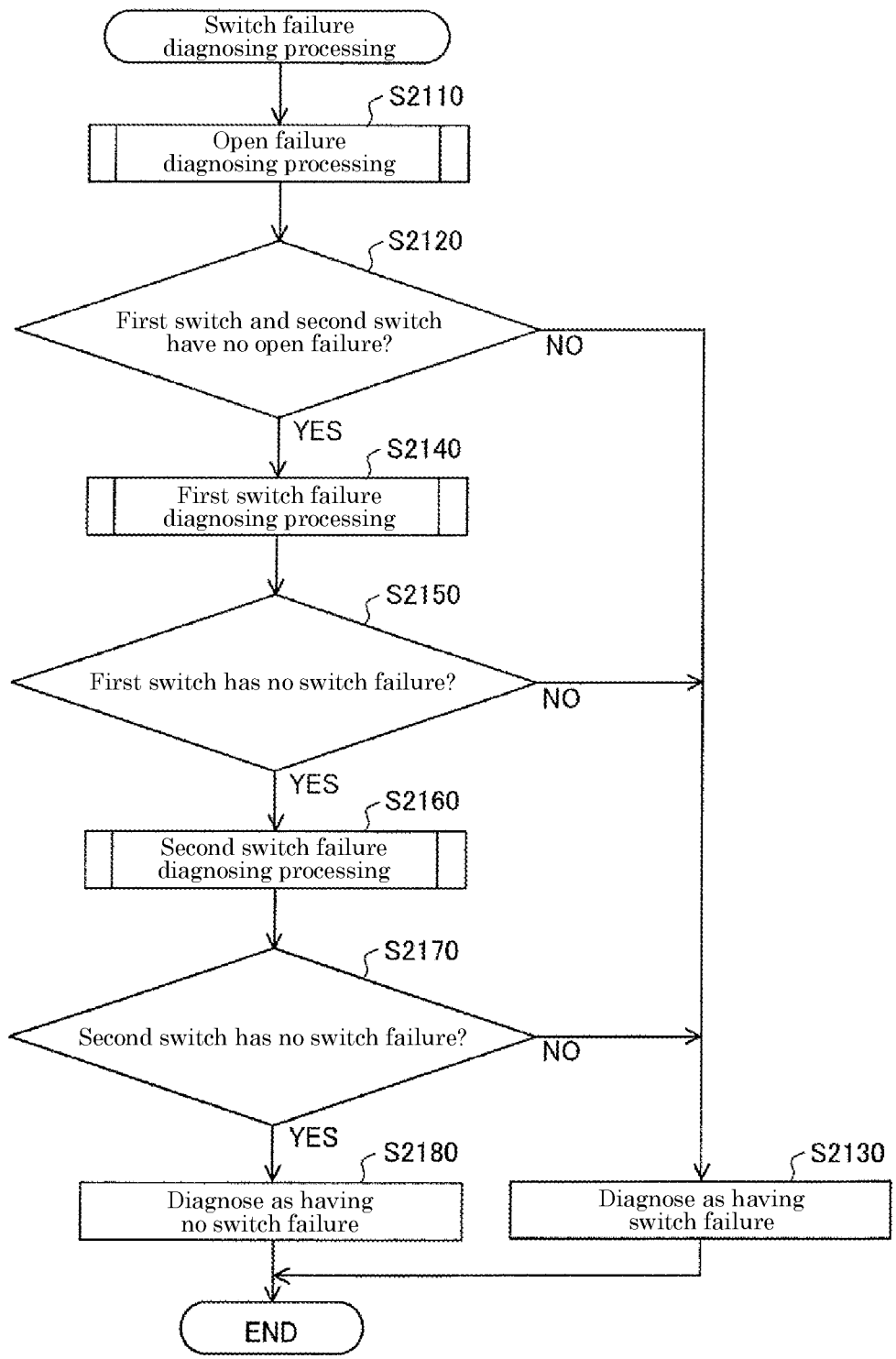
FIG. 9 is a flow chart showing switch failure diagnosing processing according to the second embodiment.

FIG. 9 is a flow chart showing the switch failure diagnosing processing executed by the CPU 2400. The switch failure diagnosing processing is started, at a time, during discharging from the secondary battery 2200 to the load 2500, after a lapse of a reference time after, for example, execution of the previous switch failure diagnosing processing, when a current value of the charge/discharge current detected by the current detection circuit 2380 becomes less than a defined discharge current value set in advance.

First, the CPU 2400 executes open failure diagnosing processing of diagnosing open failures of the first switch 2310 and the second switch 2350 (S2110).

Figure 10:
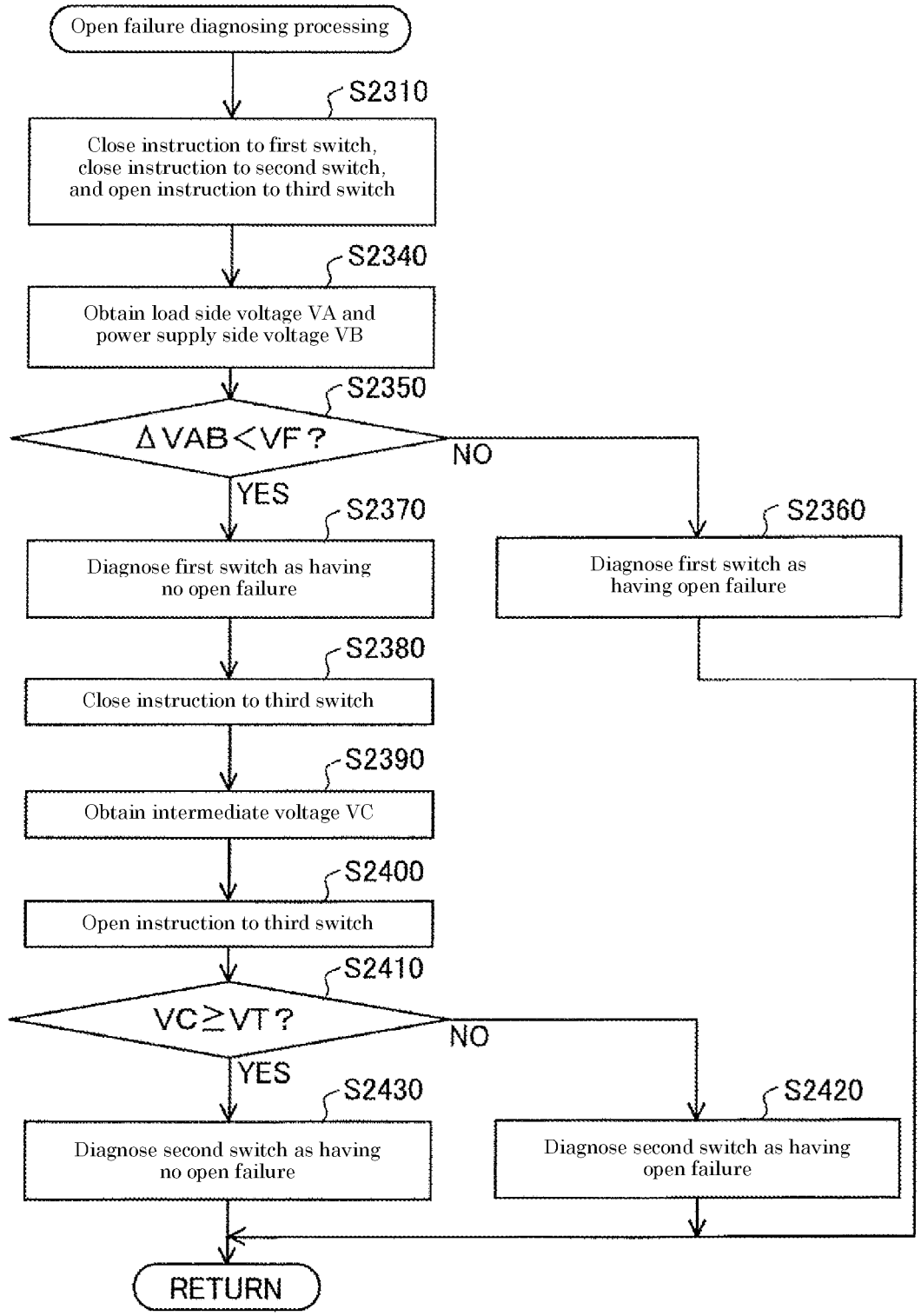
FIG. 10 is a flow chart showing open failure diagnosing processing according to the second embodiment.

FIG. 10 is a flow chart showing the open failure diagnosing processing executed by the CPU 2400. In the open failure diagnosing processing, first, determination is made whether the first switch 2310 has an open failure or not, and when the determination is made that the first switch 2310 has no open failure, determination is made whether the second switch 2350 has an open failure or not.

When starting the open failure diagnosing processing, the CPU 2400 transmits the close instruction signal to the first switch 2310, transmits the close instruction signal to the second switch 2350, and transmits the open instruction signal to the third switch 2360 (S2310). The CPU 2400 obtains the load side voltage VA and the power supply side voltage VB in a first instruction state where the close instruction signal is transmitted to the first switch 2310 and the close instruction signal is transmitted to the second switch 2350 (S2340).

Using the load side voltage VA and the power supply side voltage VB obtained at S2340, the CPU 2400 calculates a potential difference $\Delta VAB$ (=VB−VA) obtained by subtracting the load side voltage VA from the power supply side voltage VB, and compares the potential difference $\Delta VAB$ and the forward direction voltage VF (S2350).

As shown in FIG. 13, when the first switch 2310 and the second switch 2350 have no open failure, the potential difference $\Delta VAB$ becomes approximately zero. On the other hand, when the first switch 2310 has an open failure and the second switch 2350 has no open failure, the potential difference $\Delta VAB$ attains the forward direction voltage VF. When the potential difference $\Delta VAB$ is not less than the forward direction voltage VF (S2350: NO), the CPU 2400 determines that the first switch 2310 has an open failure (S2360) to end the open failure diagnosing processing.

On the other hand, when the potential difference $\Delta VAB$ is less than the forward direction voltage VF (S2350: YES), the CPU 2400 determines that the first switch 2310 has no open failure (S2370). When determining that the first switch 2310 has no open failure, the CPU 2400 transmits the close instruction signal to the third switch 2360 (S2380) to obtain the intermediate voltage VC in the first instruction state (S2390).

Upon completing obtaining the intermediate voltage VC in the first instruction state, the CPU 2400 transmits the open instruction signal to the third switch 2360 (S2400) to bring the third switch 2360 into the open state. Specifically, during a period of obtaining the intermediate voltage VC, the CPU 2400 transmits the close instruction signal to the third switch 2360 to bring the third switch 2360 into the closed state and during a period of obtaining no intermediate voltage VC, transmits the open instruction signal to the third switch 2360 to bring the third switch 2360 into the open state.

The CPU 2400 compares the intermediate voltage VC obtained at S2390 and a threshold voltage VT (S2410). Here, the "threshold voltage VT" is set to be a voltage lower than the power supply side voltage VB and more specifically, is set to be a voltage lower than a discharging end voltage of the secondary battery 2200 at which discharging of the secondary battery 2200 is inhibited in order to prevent the secondary battery 2200 from overdischarging. The threshold voltage VT is one example of the second threshold voltage.

As shown in FIG. 13, when the first switch 2310 and the second switch 2350 have no open failure, the intermediate voltage VC is approximately equal to the power supply side voltage VB. On the other hand, since when the first switch 2310 has no open failure and the second switch 2350 has an open failure, the intermediate voltage VC becomes the ground voltage because the third switch 2360 is in the closed state. When the intermediate voltage VC is less than the threshold voltage VT (S2410: NO), the CPU 2400 determines that the second switch 2350 has an open failure (S2420) to end the open failure diagnosing processing.

On the other hand, when the intermediate voltage VC is not less than the threshold voltage VT (S2410: YES), the CPU 2400 determines that the second switch 2350 has no open failure (S2430) to end the open failure diagnosing processing.

As shown in FIG. 9, in the switch failure diagnosing processing, upon completion of the open failure diagnosing processing, the CPU 2400 determines whether an open failure is present or absent (S2120). When determining that at least one of the first switch 2310 and the second switch 2350 has an open failure in the open failure diagnosing processing, the CPU 2400 determines that an open failure is present (S2120: NO). In this case, the CPU 2400 determines that at least one of the first switch 2310 and the second switch 2350 has a switch failure (S2130) to end the switch failure diagnosing processing.

On the other hand, when determining that neither the first switch 2310 nor the second switch 2350 has an open failure in the open failure diagnosing processing, the CPU 2400 determines that no open failure develops (S2120: YES). In this case, the CPU 2400 subsequently executes first switch failure diagnosing processing of diagnosing a switch failure of the first switch 2310 (S2140).

Figure 11:
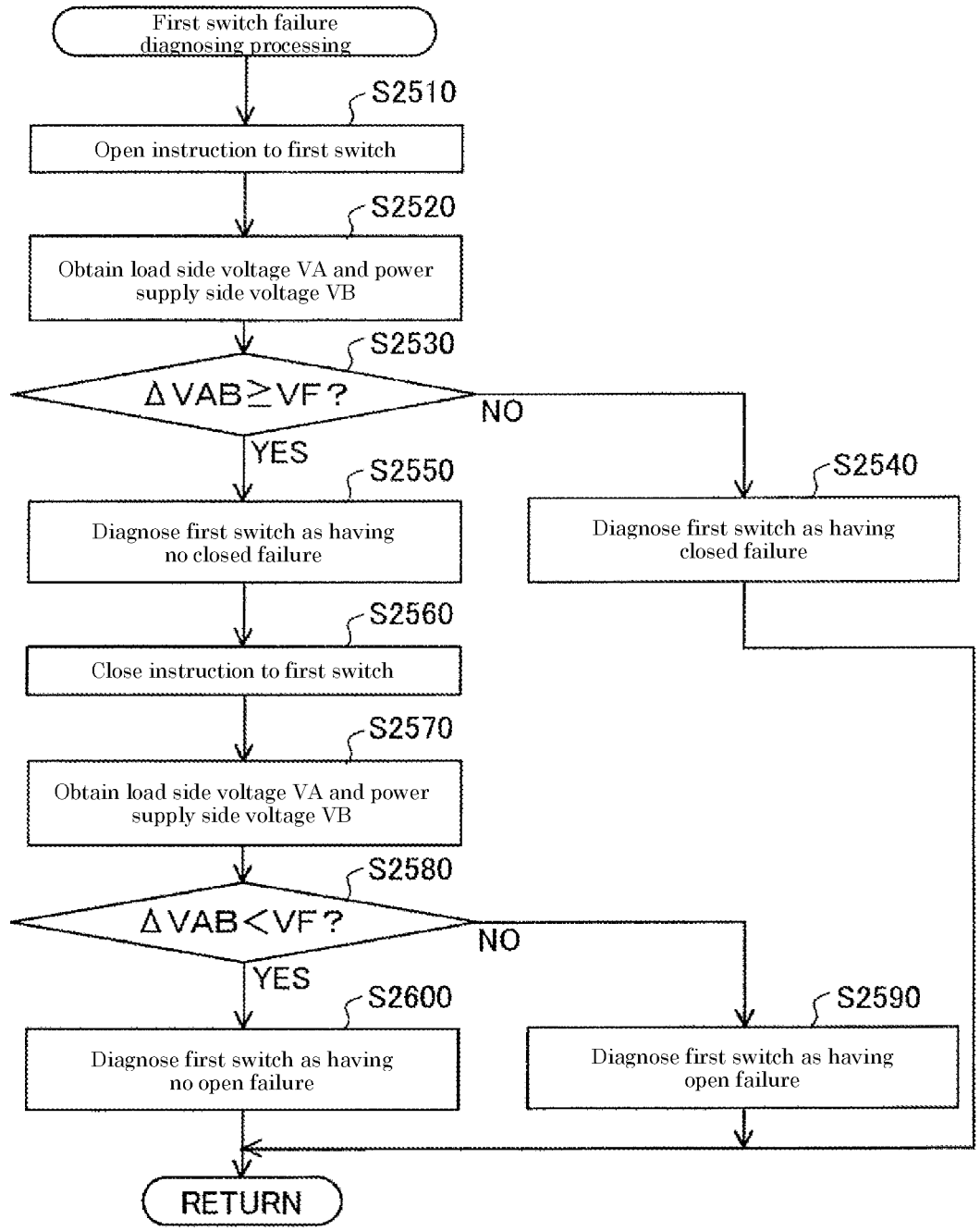
FIG. 11 is a flow chart showing first switch failure diagnosing processing according to the second embodiment.

FIG. 11 is a flow chart showing the first switch failure diagnosing processing executed by the CPU 2400. In the first switch failure diagnosing processing, first, determination is made whether the first switch 2310 has a closed failure or not, and when the determination is made that the first switch 2310 has no closed failure, another determination is made whether the first switch 2310 has an open failure or not.

When starting the first switch failure diagnosing processing, the CPU 2400 transmits the open instruction signal to the first switch 2310 while maintaining transmission of the close instruction signal to the second switch 2350 (S2510). The CPU 2400 obtains the load side voltage VA and the power supply side voltage VB in a second instruction state where the open instruction signal is transmitted to the first switch 2310 and the close instruction signal is transmitted to the second switch 2350 (S2520).

Using the load side voltage VA and the power supply side voltage VB obtained at S2520, the CPU 2400 calculates a potential difference $\Delta VAB$ and compares the potential difference $\Delta VAB$ and the forward direction voltage VF (S2530).

As shown in FIG. 13, when the first switch 2310 and the second switch 2350 have no closed failure, the potential difference ΔVAB becomes the forward direction voltage VF. On the other hand, when the first switch 2310 has a closed failure and the second switch 2350 has no closed failure, the potential difference ΔVAB attains approximately zero. When the potential difference ΔVAB is less than the forward direction voltage VF (S2530: NO), the CPU 2400 determines that the first switch 2310 has a closed failure (S2540) to end the first switch failure diagnosing processing.

On the other hand, when the potential difference ΔVAB is not less than the forward direction voltage VF (S2530: YES), the CPU 2400 determines that the first switch 2310 has no closed failure (S2550). When determining that the first switch 2310 has no closed failure, the CPU 2400 transmits the close instruction signal to the first switch 2310 to return the switch to the first instruction state (S2560) and obtains the load side voltage VA and the power supply side voltage VB in the first instruction state (S2570).

Using the load side voltage VA and the power supply side voltage VB obtained at S2570, the CPU 2400 calculates a potential difference ΔVAB and compares the potential difference ΔVAB and the forward direction voltage VF (S2580). When the potential difference ΔVAB is not less than the forward direction voltage VF (S2580: NO), the CPU 2400 determines that the first switch 2310 has an open failure due to the open instruction signal to the first switch 2310 at S2510 (S2590) to end the open failure diagnosing processing.

On the other hand, when the potential difference ΔVAB is less than the forward direction voltage VF (S2580: YES), the CPU 2400 determines that the first switch 2310 has no open failure (S2600) to end the first switch failure diagnosing processing.

As shown in FIG. 9, in the switch failure diagnosing processing, upon completion of the first switch failure diagnosing processing, the CPU 2400 determines whether a switch failure is present or absent in the first switch 2310 (S2150). When determining that the first switch 2310 has either one of a closed failure and an open failure in the first switch failure diagnosing processing, the CPU 2400 determines that the first switch 2310 has a switch failure (S2150: NO). In this case, the CPU 2400 executes the processing from S2130 to end the switch failure diagnosing processing.

On the other hand, when diagnosing that the first switch 2310 has neither a closed failure nor an open failure in the first switch failure diagnosing processing, the CPU 2400 determines that the first switch 2310 has no switch failure (S2150: YES). In this case, the CPU 2400 subsequently executes second switch failure diagnosing processing of diagnosing a switch failure of the second switch 2350 (S2160).

Figure 12:
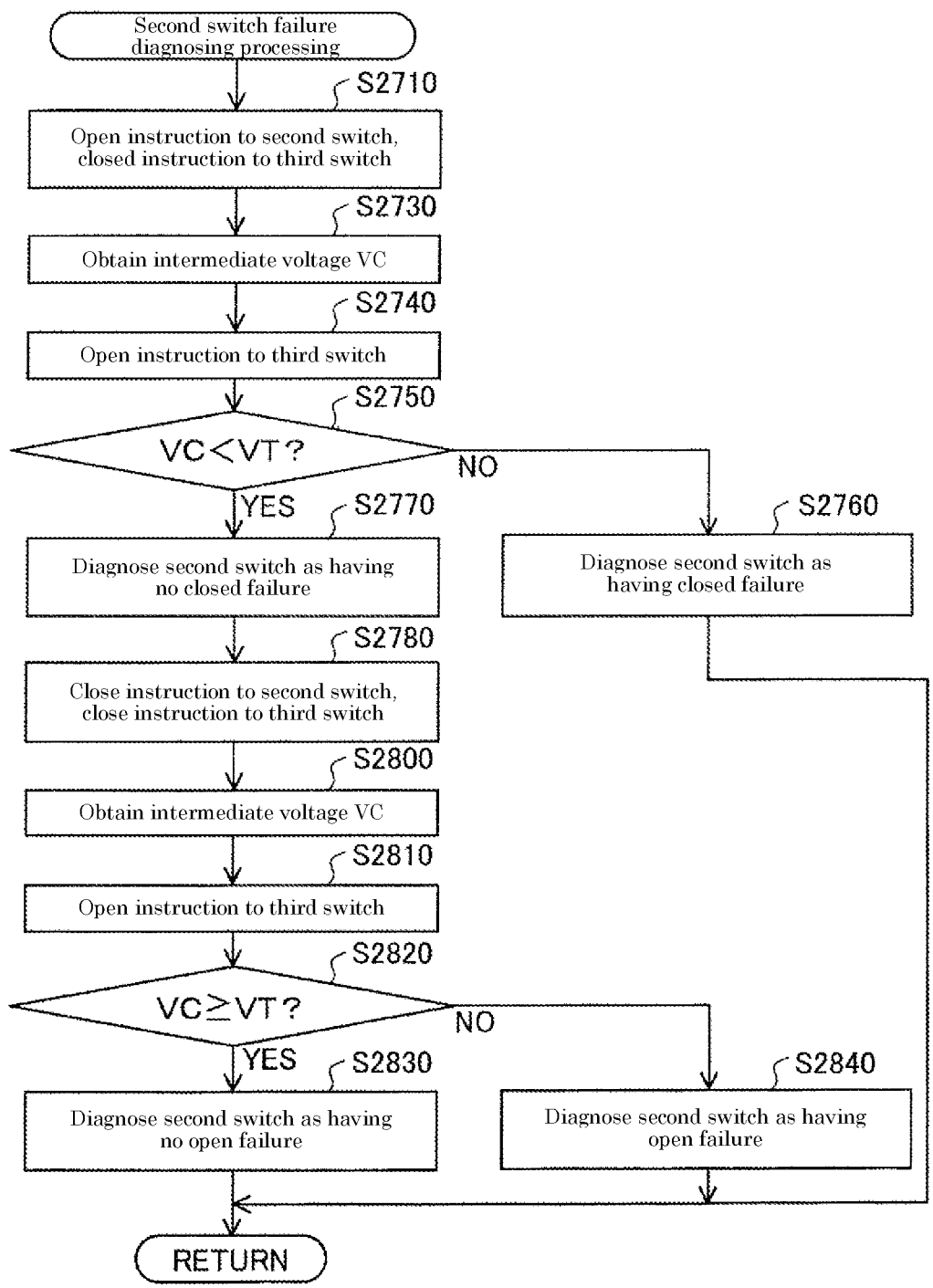
FIG. 12 is a flow chart showing second switch failure diagnosing processing according to the second embodiment.

FIG. 12 is a flow chart showing the second switch failure diagnosing processing executed by the CPU 2400. In the second switch failure diagnosing processing, first, determination is made whether the second switch 2350 has a closed failure or not, and when the determination is made that the second switch 2350 has no closed failure, another determination is made whether the second switch 2350 has an open failure or not.

When starting the second switch failure diagnosing processing, the CPU 2400 transmits the open instruction signal to the second switch 2350 and transmits the close instruction signal to the third switch 2360 while maintaining transmission of the close instruction signal to the first switch 2310 (S2710). The CPU 2400 transmits the close instruction signal to the first switch 2310 to obtain the intermediate voltage VC in a third instruction state where the open instruction signal is transmitted to the second switch 2350 (S2730). Upon completing obtaining the intermediate voltage VC in the third instruction state, the CPU 2400 transmits the open instruction signal to the third switch 2360 (S2740) to bring the third switch 2360 into the open state.

The CPU 2400 compares the intermediate voltage VC obtained at S2730 and the threshold voltage VT (S2750).

As shown in FIG. 13, when the first switch 2310 and the second switch 2350 have no closed failure, the intermediate voltage VC becomes the ground voltage. On the other hand, when the first switch 2310 has no closed failure and the second switch 2350 has a closed failure, the intermediate voltage VC becomes approximately equal to the power supply side voltage VB. When the intermediate voltage VC is not less than the threshold voltage VT (S2750: NO), the CPU 2400 determines that the second switch 2350 has a closed failure (S2760) to end the second switch failure diagnosing processing.

On the other hand, when the intermediate voltage VC is less than the threshold voltage VT (S2750: YES), the CPU 2400 determines that the second switch 2350 has no closed failure (S2760). When determining that the second switch 2350 has no closed failure, the CPU 2400 transmits the close instruction signal to the second switch 2350 to return the switch to the first instruction state and also transmits the close instruction signal to the third switch 2360 (S2780) to obtain the intermediate voltage VC in the first instruction state (S2800). Upon completing obtaining the intermediate voltage VC in the first instruction state, the CPU 2400 transmits the open instruction signal to the third switch 2360 (S2810) to bring the third switch 2360 into the open state.

The CPU 2400 compares the intermediate voltage VC obtained at S2800 and the threshold voltage VT (S2820). When the intermediate voltage VC is less than the threshold voltage VT (S2820: NO), the CPU 2400 determines that the second switch 2350 has an open failure due to the open instruction signal transmitted to the second switch 2350 at S2710 (S2830) to end the second switch failure diagnosing processing.

On the other hand, when the intermediate voltage VC is not less than the threshold voltage VT (S2820: YES), the CPU 2400 determines that the second switch 2350 has no open failure (S2840) to end the second switch failure diagnosing processing.

As shown in FIG. 9, in the switch failure diagnosing processing, upon completion of the second switch failure diagnosing processing, the CPU 2400 determines whether a switch failure of the second switch 2350 is present or absent (S2170). When determining that the second switch 2350 has either one of a closed failure and an open failure in the second switch failure diagnosing processing, the CPU 2400 determines that the second switch 2350 has a switch failure (S2170: NO). In this case, the CPU 2400 executes the processing from S2130 to end the switch failure diagnosing processing.

On the other hand, when determining that the second switch 2350 has neither a closed failure nor an open failure in the second switch failure diagnosing processing, the CPU 2400 determines that the second switch 2350 has no switch failure (S2170: YES). In this case, determination is made that neither the first switch 2310 nor the second switch 2350 has a switch failure (S2180) to end the switch failure diagnosing processing.

As described in the foregoing, according to the present embodiment, in the open failure diagnosing processing of the switch failure diagnosing processing, determination whether the first switch 2310 and the second switch 2350 have an open failure or not is made in the first instruction state where the close instruction signal is transmitted to the first switch 2310 and the close instruction signal is transmitted to the second switch 2350 (S2310). Therefore, unless the first switch 2310 and the second switch 2350 simultaneously develop an open failure, no power fail occurs. In other words, even when one switch has an open failure to be in the open state against the close instruction signal, a current path can be ensured between the secondary battery 2200 and the load 2500 via the other switch to suppress a power fail from occurring.

In the present embodiment, determination whether the first switch 2310 has a closed failure or not in the switch failure diagnosing processing is made when the determination is made that the first switch 2310 and the second switch 2350 have no open failure (S2120: YES). Therefore, in order to determine whether the first switch 2310 has a closed failure or not in the first switch failure diagnosing processing of the switch failure diagnosing processing, even when the open instruction signal is transmitted to the first switch 2310 and the close instruction signal is transmitted to the second switch 2350 to bring into the second instruction state (S2510), the second switch 2350 is reliably in the closed state, so that a power fail can be suppressed from occurring.

In the present embodiment, in the first switch failure diagnosing processing of the switch failure diagnosing processing, after giving an instruction to bring the first switch 2310 into the open state, another determination is made whether the first switch 2310 has an open failure or not (S2580). Therefore, a switch failure of the first switch 2310 developed during the switch failure diagnosing processing can be diagnosed during the switch failure diagnosing processing.

In the present embodiment, determination whether the second switch 2350 has a closed failure or not in the switch failure diagnosing processing is made when the determination is made that the first switch 2310 and the second switch 2350 have no open failure (S2120: YES). Therefore, in order to determine whether the second switch 2350 has a closed failure or not in the second switch failure diagnosing processing of the switch failure diagnosing processing, even when the close instruction signal is transmitted to the first switch 2310 and the open instruction signal is transmitted to the second switch 2350 to bring into the third instruction state (S2710), the first switch 2310 is reliably in the closed state, so that a power fail can be suppressed from occurring.

In the present embodiment, in the second switch failure diagnosing processing of the switch failure diagnosing processing, after giving an instruction to bring the second switch 2350 into the open state, another determination is made whether the second switch 2350 has an open failure or not (S2820). Therefore, a switch failure of the second switch 2350 developed during the switch failure diagnosing processing can be diagnosed during the switch failure diagnosing processing.

In the present embodiment, the battery protective device 2300 is provided with the ground circuit 2330, in which the intermediate voltage VC becomes approximately equal to the power supply side voltage VB when the second switch 2350 enters the closed state, and becomes the ground voltage when the second switch 2350 enters the open state and the third switch 2360 enters the closed state. Therefore, obtaining the intermediate voltage VC enables determination of a state of the second switch 2350. Without the ground circuit 2330 in the battery protective device 2300, the intermediate voltage VC in a case where the second switch 2350 enters the open state becomes unstable, so that the intermediate voltage VC in a case where the second switch 2350 enters the open state might become equal to the intermediate voltage VC in a case where the second switch 2350 enters the closed state. Providing the ground circuit 2330 in the battery protective device 2300 enables the intermediate voltage VC to be stabilized at the ground voltage in a case where the second switch 2350 enters the open state, thereby reliably making different the intermediate voltage VC in a case where the second switch 2350 enters the open state and the intermediate voltage VC in a case where the second switch 2350 enters the closed state.

On the other hand, when the middle point T23 between the second switch 2350 and the diode D is constantly connected to the ground voltage via the ground circuit 2330, there occurs a problem that when the second switch 2350 enters the closed state, current flows from the secondary battery 2200 to the ground voltage via the resistance element R2 to wastefully consume power accumulated in the secondary battery 2200.

In the present embodiment, with the third switch 2360 provided in the ground circuit 2330, the close instruction signal is transmitted to the third switch 2360 to bring the third switch 2360 into the closed state during a period of detecting the intermediate voltage VC by the voltage detection circuit 2370, and the open instruction signal is transmitted to the third switch 2360 to bring the third switch 2360 into the open state during a period of detecting no intermediate voltage VC by the voltage detection circuit 2370 (S2380 to S2400, S2710 to S2740, and S2780 to S2810). This suppresses wasteful consumption of power accumulated in the secondary battery 2200 during the period of detecting no intermediate voltage VC by the voltage detection circuit 2370.

In the present embodiment, in the battery protective device 2300, the diode D is connected in series to the second switch 2350, while the diode is not connected in series to the first switch 2310. If the diode is connected in series also to the first switch 2310, a potential difference $\Delta$VAB in a case where the first switch 2310 enters the closed state and the second switch 2350 enters the closed state and a potential difference $\Delta$VAB in a case where the first switch 2310 enters the open state and the second switch 2350 enters the closed state become equal to each other, so that an open failure of the first switch 2310 cannot be diagnosed in the first instruction state.

In the present embodiment, since the diode D is connected in series to the second switch 2350 and the diode D is not connected in series to the first switch 2310, the potential difference $\Delta$VAB in a case where the first switch 2310 enters the closed state and the second switch 2350 enters the closed state and the potential difference $\Delta$VAB in a case where the first switch 2310 enters the open state and the second switch 2350 enters the closed state can be varied from each other. This enables a diagnosis of an open failure of the first switch 2310 in the first instruction state.

Additionally, since the diode D generates the forward direction voltage VF in the forward direction when current flows, a voltage difference can be easily generated. Additionally, since the diode D is arranged such that the direction from the secondary battery 2200 side toward the load 2500 side is the forward direction, when a charger is connected in place of the load 2500, the secondary battery 2200 can be prevented from being charged via the second switch 2350.

Further, because the diode D is connected in series to the second switch 2350, the forward direction voltage VF of the diode D suppresses a large current from flowing to the second switch 2350. Therefore, it is not necessary to use a large current relay such as a contact relay as the second switch 2350, and therefore, the switching circuit 2320 can be configured using such a small current switch as a field-effect transistor.

In the present embodiment, when a current value of the charge/discharge current detected by the current detection circuit 2380 of the battery protective device 2300 becomes less than a defined discharge current value, the switch failure diagnosing processing is executed. Therefore, as compared with execution of the switch failure diagnosing processing when the discharge current value is not less than the defined discharge current value, switch failures of the first switch 2310 and the second switch 2350 can be diagnosed using a smaller potential difference ΔVAB or intermediate voltage VC.

2B. Modification

The techniques recited in the present specification are not limited to the above second embodiment, but can be modified in various forms without departing from a scope thereof, and allows for, for example, the modification described in the first embodiment.

In the above embodiment, a field-effect transistor is recited as examples of the second switch 2350 and the third switch 2360. However, the second switch 2350 and the third switch 2360 are not limited thereto, but may be a contact relay.

Designing the first switch 2310 and the second switch 2350 to be normally-off switches prevents a rush current from flowing to the load 2500 at the time of starting the battery protective device 2300. Additionally, since the third switch 2360 enters the closed state during a period of detecting the intermediate voltage VC by the voltage detection circuit 2370 and enters the open state during a period of detecting no intermediate voltage VC by the voltage detection circuit 2370, designing the third switch 2360 to be a normally-off switch facilitates control of the third switch 2360.

The above embodiment has a configuration in which the diode D is connected in series to the second switch 2350. However, an element connected in series to the second switch 2350 is not limited thereto, but may be a resistance element having high resistivity, for example, a resistance element having a resistance value of about 1 MΩ.

The above embodiment has a configuration including the ground circuit 2330 connected between the middle point T23 of the switching circuit 2320 and the ground point T24. However, the ground circuit 2330 may be connected between the middle point T23 of the switching circuit 2320 and a connection point connected to a reference voltage different from the ground voltage. Further, even without the ground circuit 2330, when the intermediate voltage VC in a case where the second switch 2350 enters the open state is fixed to a constant voltage value, and the intermediate voltage VC in a case where the second switch 2350 enters the open state and the intermediate voltage VC in a case where the second switch 2350 enters the closed state are different from each other, the ground circuit 2330 may not necessarily be provided.

The above embodiment has a configuration including the third switch 2360 in the ground circuit 2330. However, for example, in a case where due to a large resistance value of the resistance element R2, the second switch 2350 enters the closed state and the third switch 2360 enters the closed state, when an amount of current flowing via the resistance element R2 is small and consumed power of the secondary battery 2200 is small, the third switch 2360 may not necessarily be provided in the ground circuit 2330.

In the above embodiment, the forward direction voltage VF is recited as an example of a reference voltage at the time of diagnosing a switch failure of the first switch 2310. However, the reference voltage may be appropriately increased or decreased taking into consideration of, for example, effects of a resistance, noise and the like of the wire 2510. For example, a half value of each of the forward direction voltage VF may be used as the reference voltage. This is also the case with the threshold voltage VT used at the time of diagnosing a switch failure of the second switch 2350 and the voltage may be appropriately selected from voltages between the power supply side voltage VB and the ground voltage.

The above embodiment has a configuration in which the intermediate voltage VC and the threshold voltage VT are compared at the time of diagnosing a switch failure of the second switch 2350. However, a voltage for use in a diagnosis of a switch failure of the second switch 2350 is not limited to the intermediate voltage VC itself as long as the intermediate voltage VC is used, and, for example, a potential difference ΔVBC (=VB−VC) may be used which is obtained by subtracting the intermediate voltage VC from the power supply side voltage VB.

In the above embodiment, the example is shown in which the switch failure diagnosing processing is started at time, after a lapse of a reference time from the time of execution of the previous switch failure diagnosing processing, when a current value of the charge/discharge current detected by the current detection circuit 2380 becomes less than a defined discharge current value determined in advance. However, timing for starting the switch failure diagnosing processing is not limited thereto, and may be, for example, at time when either one condition is satisfied, a condition that a reference time has elapsed from the time of execution of the previous switch failure diagnosing processing and a condition that a current value of the charge/discharge current detected by the current detection circuit 2380 becomes less than a defined discharge current value determined in advance.

Although in the above embodiment, the example is shown in which in the open failure diagnosing processing, after determination is made whether the first switch 2310 has an open failure or not, determination is made whether the second switch 2350 has an open failure or not, the order of diagnosing open failures of the first switch 2310 and the second switch 2350 may be reversed. Similarly, although the example is shown in which in the switch failure diagnosing processing, after execution of the first switch failure diagnosing processing, the second switch failure diagnosing processing is executed, the order of diagnosing switch failures of the first switch 2310 and the second switch 2350 may be reversed.

In the above embodiment, the example is shown in which in the switch failure diagnosing processing, after determination whether the first switch 2310 and the second switch 2350 have an open failure or not, determination is made whether the first switch 2310 and the second switch 2350 have a closed failure or not. However, the switch failure diagnosing processing is not limited thereto, but may include up to the processing of determining whether the first switch 2310 and the second switch 2350 have an open failure or not, and the processing of determining whether either one of the first switch 2310 and the second switch 2350 has a closed failure or not. Additionally, only the processing of determining whether the first switch 2310 and the second switch 2350 have an open failure or not may be executed. Further, the switch failure diagnosing processing may include up to the processing of determining whether either one of the first switch 2310 or the second switch 2350 has an open failure or not.

In the above embodiment, the example is shown in which in the first switch failure diagnosing processing, after the determination that the first switch 2310 has no closed failure, another determination is made whether the first switch 2310 has an open failure or not. However, another determination whether the first switch 2310 has an open failure or not may not necessarily be made. This is also the case with the second switch failure diagnosing processing.

Other Embodiments

Although the power supply protective device, the power supply device and the switch failure diagnosing method according to the embodiments of the present invention have been described, the present invention is not limited to the above embodiments and modifications. In other words, the embodiments and modifications disclosed here are in all aspects for illustrative purpose only and are not to be construed limitative. The scope of the present invention is shown not by the above description but by the scope of claims and is construed to include means equivalent to the scope of claims and all the modifications within the scope of claims. Additionally, modes configured by arbitrarily combining components included in the above embodiments and modifications are also included in the scope of the present invention.

Figure 14:
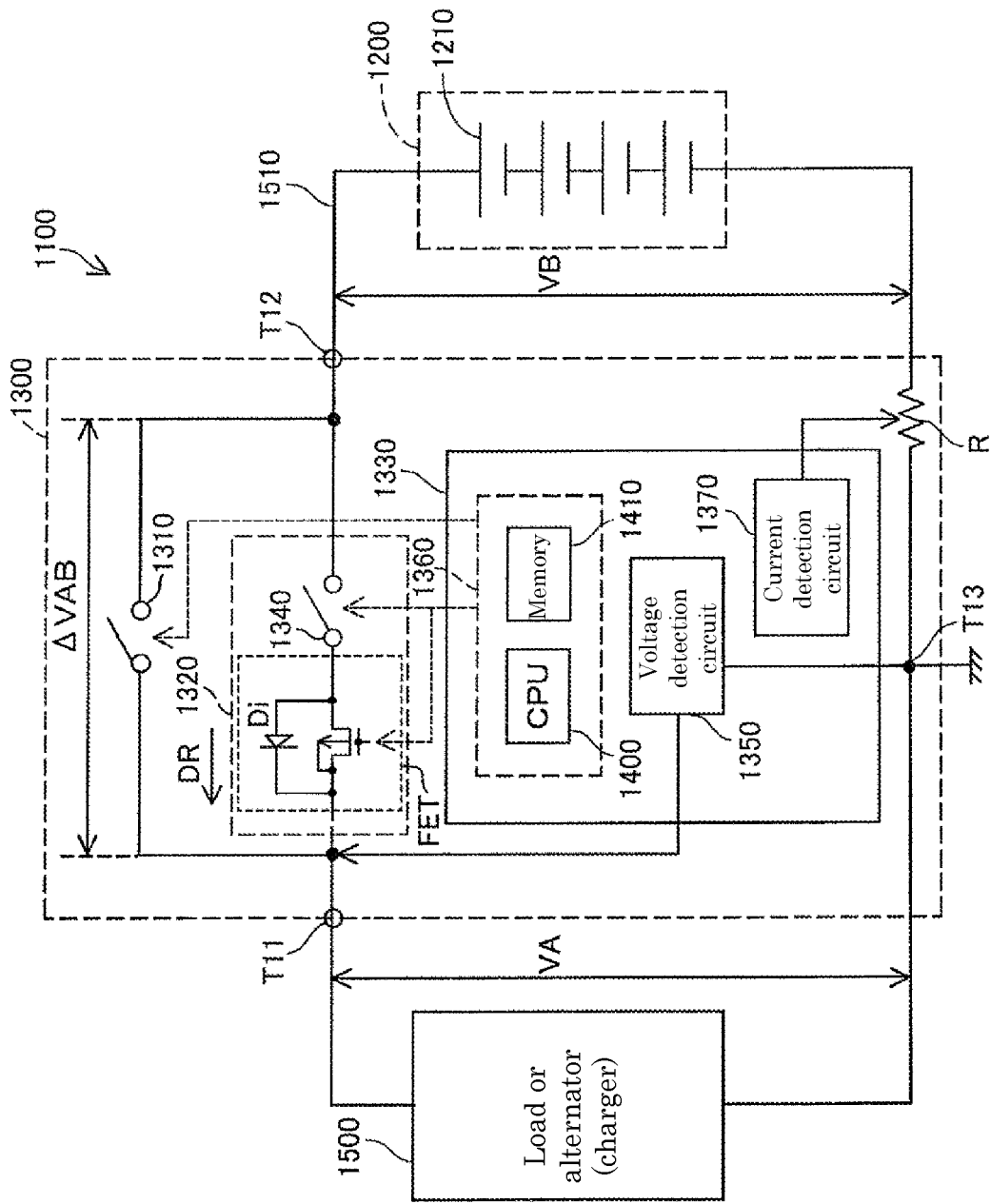
FIG. 14 is a block diagram showing a configuration of a battery protective device according to other embodiment.

For example, in the above first embodiment, the battery protective device 1300 is provided with the switching circuit 1320 including the diode D and the second switch 1340. However, the battery protective device may be configured to include an FET in place of the diode D. FIG. 14 is a block diagram showing a configuration of thus configured battery protective device 1300.

Figure 15:
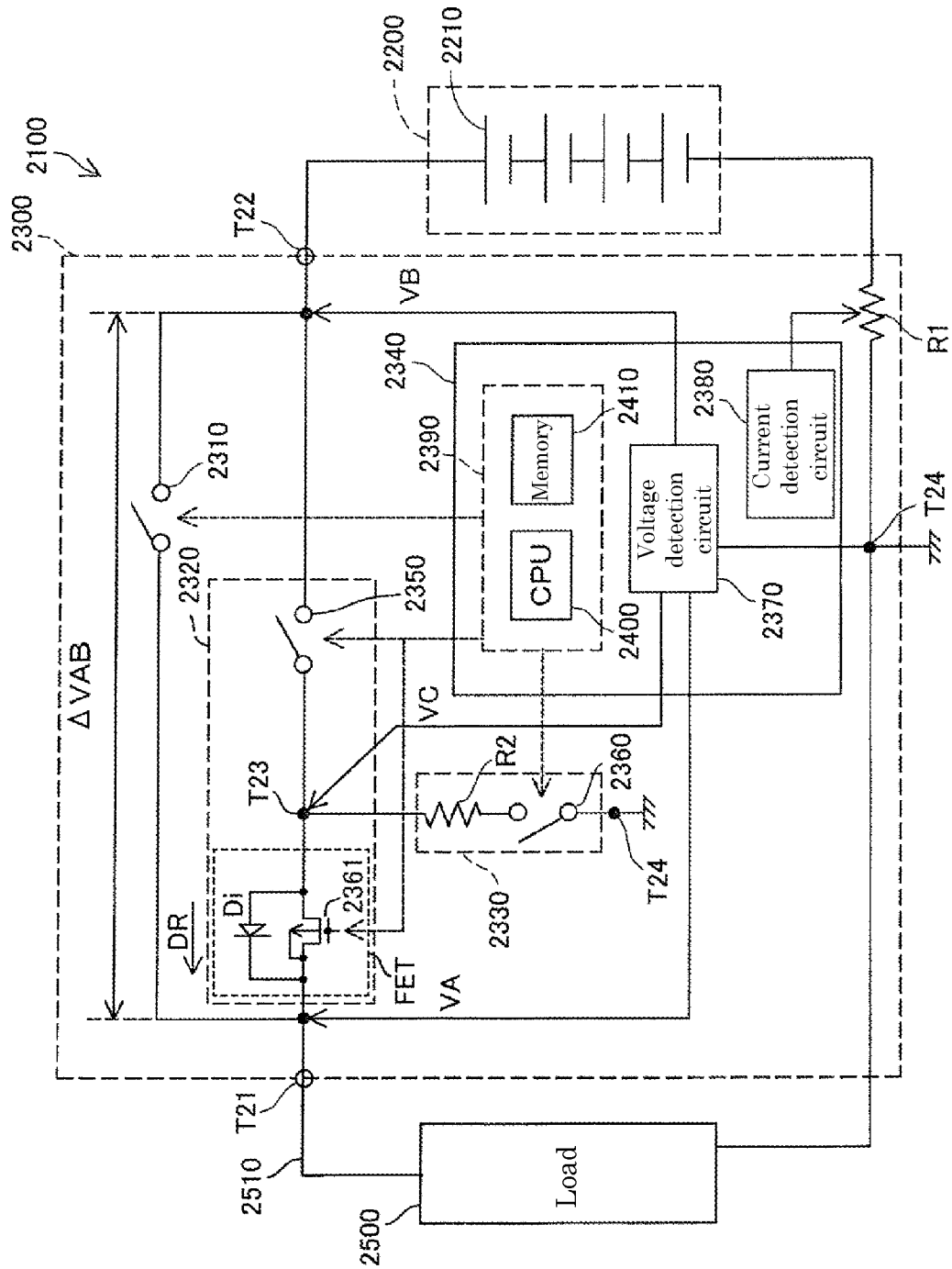
FIG. 15 is a block diagram showing a configuration of a battery protective device according to other embodiment.

Similarly, the battery pack 2100 as described in the second embodiment may be configured to include an FET in place of the diode D. FIG. 15 is a block diagram showing a configuration of thus configured battery protective device 2300. With either of the configurations shown in FIG. 14 and FIG. 15, the same effect can be produced as those of the above embodiments.

Additionally, the above second embodiment enables the diode D to be diagnosed as having a short-circuit failure or not. Specifically, the CPU 2400 determines whether the load side voltage VA and the intermediate voltage VC are coincident (VA=VC) or not in a case where the first switch 2310 is in the open state, the second switch 2350 is in the closed state, and the third switch 2360 is in the closed state. Then, when determining that the load side voltage VA and the intermediate voltage VC are coincident, the CPU 2400 diagnoses the diode D as having a short-circuit failure and when determining that the voltages are not coincident, diagnoses the diode D as having no short-circuit failure.

Additionally, the configuration in the above second embodiment as shown in FIG. 15 enables sensing of failures of a parasitic diode Di generated between a source and a drain of an FET and a fourth switch 2361. Specifically, by switching the fourth switch 2361 when the first switch 2310 is in the closed state, the second switch 2350 is in the open state, and the third switch 2360 is in the closed state, the CPU 2400 enables failures of the parasitic diode Di and the fourth switch 2361 to be sensed. Specifically, in a case where the fourth switch 2361 is in the open state, when the load side voltage VA and the intermediate voltage VC are coincident (VA=VC), the CPU 2400 diagnoses that the parasitic diode Di or the fourth switch 2361 has a short-circuit failure. Additionally, in a case where the fourth switch 2361 is in the closed state, when the load side voltage VA and the intermediate voltage VC are not coincident (VA=VC), the CPU 2400 diagnoses that the parasitic diode Di and the fourth switch 2361 have an open failure.

Additionally, the above described technique is applicable to determination of a failure of a current path in a configuration where a switch is provided on a current path in a DC-DC converter, a generator, a solar-power generation system, an electronic apparatus, a vehicle, a household appliance, and the like.

Additionally, the present invention enables a failure of a switch to be sensed without stopping power supply.

Additionally, the present invention can be realized in various modes, and may be realized, for example, as a method for executing a power supply protective device, a program for realizing the functions of the power supply protective device, or a circuit diagnosis device operable by the method or the program.

DESCRIPTION OF REFERENCE SIGNS

1100, 2100 battery pack
1200, 2200 secondary battery
1300, 2300 battery protective device
1310, 2310 first switch
1320, 2320 switching circuit
1330, 2340 battery monitoring unit
1340, 2350 second switch
1350, 2370 voltage detection circuit
1360, 2390 control unit
1370, 2380 current detection circuit
1400, 2400 CPU
1410, 2410 memory
1500, 2500 load
2330 ground circuit
2360 third switch
2361 fourth switch
D diode
R, R1, R2 resistance element
T11, T12, T21, T22 connection terminal
T13, T24 ground point
T23 middle point
ΔV voltage difference
VA load side voltage
VB power supply side voltage
ΔVAB end-to-end voltage (potential difference)
VAD, VCD open voltage
VAE, VCE close voltage
VF forward direction voltage
VG discrimination voltage
VC intermediate voltage
VF forward direction voltage
VT threshold voltage

The invention claimed is:
1. A power supply protective device, comprising:
a first switch provided between a first terminal to which at least one of a load and a charger is connected and a second terminal to which a power supply is connected;
a switching circuit connected in parallel to the first switch and including a second switch and a voltage drop element connected in series to the second switch, the voltage drop element causing a voltage drop of a reference voltage by a current flow;

a voltage detection unit which detects at least one voltage of a first voltage as a voltage of the first terminal, a second voltage as a voltage of the second terminal, and a third voltage as a voltage at a point between the second switch and the voltage drop element; and a control unit which gives, to the first switch and the second switch, an open instruction to bring the switch into an open state and a close instruction to bring the switch into a closed state to control switching, and obtains a voltage from the voltage detection unit, wherein the control unit, when obtaining an open voltage in a case where the second switch is brought into the closed state and the first switch is brought into the open state during discharging of the power supply, and obtaining a close voltage in a case where the second switch is brought into the closed state and the first switch is brought into the closed state during discharging of the power supply, diagnoses the first switch as having a failure or not on a basis of the open voltage and the close voltage, and wherein the voltage detection unit detects a voltage of the first terminal and does not detect a voltage of the second terminal, and the control unit diagnoses the first switch as having the failure or not on a basis of a comparison result obtained by comparing a difference voltage between the close voltage and the open voltage with a first threshold voltage corresponding to the reference voltage.

2. The power supply protective device according to claim 1, wherein the voltage drop element comprises a diode with a current direction from a power supply side toward a load side or a charger side as a forward direction, and the reference voltage comprises a forward direction voltage of the diode.

3. The power supply protective device according to claim 1, wherein the control unit diagnoses the first switch as having no failure when a first condition is satisfied that the difference voltage is not less than the first threshold voltage, and diagnoses the first switch as having an open failure or a closed failure when the first condition is not satisfied.

4. The power supply protective device according to claim 3, wherein the control unit obtains a discrimination voltage in a case where the second switch is controlled to be in the open state and the first switch is controlled to be in the closed state during discharging of the power supply, and when the first condition is not satisfied and a second condition is satisfied that the discrimination voltage is not less than the open voltage, diagnoses the first switch as having a closed failure, and when the first condition and the second condition are not satisfied, diagnoses the first switch as having an open failure.

5. The power supply protective device according to claim 1, wherein the voltage detection unit detects a first terminal voltage of the first terminal and a second terminal voltage of the second terminal, and wherein the control unit obtains the first terminal voltage and the second terminal voltage in a case where the second switch is controlled to be in the closed state and the first switch is controlled to be in the open state during discharging of the power supply, obtains the open voltage by subtracting the first terminal voltage from the second terminal voltage, obtains the first terminal voltage and the second terminal voltage in a case where the second switch is controlled to be in the closed state and the first switch is controlled to be in the closed state during discharging of the power supply, obtains the close voltage by subtracting the first terminal voltage from the second terminal voltage, and diagnoses the first switch as having a failure or not on the basis of a comparison result obtained by comparing the close voltage and the open voltage, respectively, with a second threshold voltage corresponding to the reference voltage.

6. The power supply protective device according to claim 5, wherein the control unit diagnoses the first switch as having a closed failure when the open voltage is less than the second threshold voltage, and diagnoses the first switch as having an open failure when the close voltage is not less than the second threshold voltage.

7. The power supply protective device according to claim 5, wherein the control unit diagnoses the second switch as having an open failure when at least one of the open voltage and the close voltage is not less than a third threshold voltage corresponding to the second terminal voltage, the third threshold voltage being higher than the reference voltage.

8. The power supply protective device according to claim 7, wherein the control unit obtains a cutoff voltage in a case where the second switch is controlled to be in the open state and the first switch is controlled to be in the open state during discharging of the power supply, and when the cutoff voltage is not less than the third threshold voltage, diagnoses the second switch as having no failure, and when the cutoff voltage is less than the third threshold voltage, diagnoses the second switch as having a closed failure, and wherein the control unit obtains the cutoff voltage at timing when power supply to the load is configured to be cut off.

9. The power supply protective device according to claim 1, further comprising a current detection unit which detects a discharge current from the power supply, wherein the control unit obtains a discharge current value from the current detection unit and diagnoses at least the first switch as having a failure or not on condition that the discharge current value becomes less than a defined discharge current value.

10. The power supply protective device according to claim 1, wherein the control unit executes instruction processing of giving the open instruction to the first switch and giving the close instruction to the second switch on condition that the first switch and the second switch have no open failure, and determines that the first switch has no closed failure when a voltage difference between the first voltage and the second voltage detected by the voltage detection unit during execution of the instruction processing is not less than a second threshold voltage.

11. The power supply protective device according to claim 10, wherein the control unit executes another instruction processing of giving the close instruction to the first switch and giving the close instruction to the second switch on condition that the first switch is determined not to have a closed failure, and determines that the first switch has no open failure when a voltage difference between the first voltage and the second voltage detected by the voltage detection unit during execution of said another instruction processing is less than the second threshold voltage.

12. The power supply protective device according to claim 1, wherein the control unit executes instruction processing of giving the close instruction to the first switch and giving the open instruction to the second switch on condition that the first switch and the second switch are determined to have no open failure, and determines that the second switch has no closed failure when the third voltage detected by the voltage detection unit during execution of the instruction processing is less than a second threshold voltage.

13. The power supply protective device according to claim 12, wherein the control unit executes another instruction processing of giving the close instruction to the first switch and giving the close instruction to the second switch on condition that the second switch is determined to have no closed failure, and determines that the second switch has no open failure when the third voltage detected by the voltage detection unit during execution of said another instruction processing is not less than the second threshold voltage.

14. The power supply protective device according to claim 1, further comprising a ground circuit which includes a resistance element and connects a point between the second switch and the voltage drop element to a ground voltage via the resistance element.

15. The power supply protective device according to claim 14, wherein the ground circuit includes a third switch and the control unit performs at least one of:
   giving the open instruction to the third switch when determining whether the first switch has an open failure or not; and
   giving the close instruction to the third switch when determining whether the second switch has an open failure or not.

16. The power supply protective device according to claim 1, wherein the voltage drop element comprises a diode with a current direction from a power supply side toward a load side as a forward direction, and the first threshold voltage comprises a forward direction voltage of the diode.

17. The power supply protective device according to claim 1, further comprising a current detection unit which detects a discharge current from the power supply,
   wherein the control unit executes the instruction processing and determines whether the first switch and the second switch have an open failure or not on condition that a current value of the discharge current detected by the current detection unit becomes less than a defined value.

18. The power supply protective device according to claim 1, wherein the control unit further determines whether the voltage drop element has a short-circuit failure or an open failure on a basis of a comparison result obtained by comparing the first voltage and the third voltage.

19. A power supply device, comprising:
   a power supply; and
   a power supply protective device, comprising:
      a first switch provided between a first terminal to which at least one of a load and a charger is connected and a second terminal to which a power supply is connected;
      a switching circuit connected in parallel to the first switch and including a second switch and a voltage drop element connected in series to the second switch, the voltage drop element causing a voltage drop of a reference voltage by a current flow;
      a voltage detection unit which detects at least one voltage of a first voltage as a voltage of the first terminal, a second voltage as a voltage of the second terminal, and a third voltage as a voltage at a point between the second switch and the voltage drop element; and
      a control unit which gives, to the first switch and the second switch, an open instruction to bring the switch into an open state and a close instruction to bring the switch into a closed state to control switching, and obtains a voltage from the voltage detection unit,
      wherein the control unit, when obtaining an open voltage in a case where the second switch is brought into the closed state and the first switch is brought into the open state during discharging of the power supply, and obtaining a close voltage in a case where the second switch is brought into the closed state and the first switch is brought into the closed state during discharging of the power supply, diagnoses the first switch as having a failure or not on a basis of the open voltage and the close voltage, and
      wherein the voltage detection unit detects a voltage of the first terminal and does not detect a voltage of the second terminal, and the control unit diagnoses the first switch as having the failure or not on a basis of a comparison result obtained by comparing a difference voltage between the close voltage and the open voltage with a threshold voltage corresponding to the reference voltage.

20. A power supply protective device, comprising:
   a first switch provided between a first terminal to which at least one of a load and a charger is connected and a second terminal to which a power supply is connected;
   a switching circuit connected in parallel to the first switch and including a second switch and a voltage drop element connected in series to the second switch, the voltage drop element causing a voltage drop of a reference voltage;
   a voltage detection circuit which detects at least one voltage of a first voltage as a voltage of the first terminal, a second voltage as a voltage of the second terminal, and a third voltage as a voltage at a point between the second switch and the voltage drop element; and
   a controller which gives, to the first switch and the second switch, an open instruction to bring the switch into an open state and a close instruction to bring the switch into a closed state,
   wherein the controller diagnoses the first switch as having a failure or not on a basis of a comparison result obtained by comparing a difference voltage between a closed state voltage, where the second switch is brought into the closed state and the first switch is brought into the closed state, and an open state voltage, where the second switch is brought into the closed state and the first switch is brought into the open state, with a threshold voltage corresponding to the reference voltage.

* * * * *